United States Patent [19]
Rao et al.

[11] Patent Number: 6,055,205
[45] Date of Patent: Apr. 25, 2000

[54] DECODER FOR A NON-VOLATILE MEMORY ARRAY USING GATE BREAKDOWN STRUCTURE IN STANDARD SUB 0.35 MICRON CMOS PROCESS

[75] Inventors: Kameswara K. Rao, San Jose; Martin L. Voogel, Santa Clara, both of Calif.

[73] Assignee: Xilinx, Inc., San Jose, Calif.

[21] Appl. No.: 09/262,981

[22] Filed: Mar. 5, 1999

[51] Int. Cl.$^7$ .................................................. G11C 8/00
[52] U.S. Cl. ...................... 365/230.06; 365/226; 365/104
[58] Field of Search .............................. 365/230.06, 226, 365/227, 102

[56] References Cited

U.S. PATENT DOCUMENTS

| | | | |
|---|---|---|---|
| 4,689,504 | 8/1987 | Raghunathan et al. | 307/449 |
| 5,563,842 | 10/1996 | Challa | 365/230.06 |
| 5,796,656 | 8/1998 | Kowshik et al. | 365/185.23 |
| 5,812,459 | 9/1998 | Atsumi et al. | 365/185.23 |

OTHER PUBLICATIONS

Ying Shi; T. P. Ma; Sharad Prasad; an Sumit Dhanda, "Polarity Dependent Gate Tunneling Currents in Dual–Gate CMOSFET's", IEEE Transactions on Electron Devices, vol. 45, No. 11, Nov. 1998, pp. 2355–2360.

*Primary Examiner*—David Nelms
*Assistant Examiner*—Thong Le
*Attorney, Agent, or Firm*—E. Eric Hoffman; Jeanette S. Harms

[57] ABSTRACT

A non-volatile memory cell is provided that includes a low voltage CMOS storage transistor having a source region and a drain region that are commonly connected to ground. The low voltage storage transistor is programmed by applying a high programming voltage to its gate, thereby rupturing the gate oxide of the storage transistor. The high programming voltage is applied to the low voltage storage transistor through a high voltage p-channel transistor. The high voltage p-channel transistor has a thicker gate oxide than the storage transistor, thereby enabling the p-channel transistor to withstand higher voltages. The high voltage p-channel transistor also has a higher breakdown voltage than a high voltage n-channel transistor of the same size. Both the low voltage storage transistor and the high voltage p-channel transistor are fabricated in accordance with a standard sub 0.35 micron process. The state of the low voltage storage transistor can be read through the p-channel transistor, or through a dedicated high voltage n-channel transistor. In one embodiment, the programming voltage is generated by a charge pump circuit fabricated in accordance with a standard sub 0.35 micron process. In another embodiment, the decoder circuits that access the non-volatile memory cell use high voltage p-channel transistors to transmit the high programming voltage. Another embodiment of the present invention includes a system-on-a-chip structure that implements the non-volatile memory of the present invention.

8 Claims, 12 Drawing Sheets

DECODER FOR A NON-VOLATILE MEMORY ARRAY USING GATE BREAKDOWN STRUCTURE IN STANDARD SUB 0.35 MICRON CMOS PROCESS

BACKGROUND OF THE INVENTION

1. Field of the Invention

The present invention relates to integrated circuits, and more specifically to a memory array architecture for standard sub 0.35 micron processes.

2. Description of the Related Art

Most integrated circuits ("chips") now in use are fabricated in what is called CMOS (complementary metal oxide semiconductor) technology, which forms both PMOS and NMOS transistors in a silicon substrate. One of the main objectives of integrated circuit technology is to minimize transistor size. Typically, transistors are described in terms of their minimum feature dimension. Current technology provides a minimum feature size of 0.35 μm or less. The minimum feature size, which is also referred to as a "line width", refers to the minimum width of a transistor feature such as the gate width, or the separation between source and drain diffusions. Typically, 0.35 μm technology is used to form CMOS transistors having a gate oxide thickness of 70 Å. A 0.18 μm technology is used to form CMOS transistors having a gate oxide thickness of 40 Å. The gate "oxide", actually a silicon dioxide layer, is the electrically insulating (dielectric) layer interposed between the conductive gate electrode, which is typically a polycrystalline silicon structure formed overlying the principal surface of the silicon substrate in which the integrated circuit is formed, and the underlying silicon which typically is the channel portion of the transistor extending between the source and drain regions. Transistors of 0.35 μm size typically operate at a voltage of 3.3 Volts. Transistors of 0.18 μm size typically operate at a voltage of 1.8 Volts. Greater voltages are likely to destroy the transistor by rupturing the gate oxide.

In the field of data storage, there are two main types of storage elements. The first type is a volatile storage element such as typically used in DRAM (dynamic random access memory) or SRAM (static random access memory) in which the information stored in a particular storage element is lost the instant that power is removed from the circuit. The second type is a non-volatile storage element in which the information is preserved even if power is removed. Typically, the types of transistor devices used to provide non-volatile storage are substantially different from those used in ordinary logic circuitry or in volatile storage, thereby requiring different fabrication techniques. Hence, if non-volatile storage is included on an integrated circuit fabricated using conventional CMOS technology, chip size and complexity are undesirably increased.

Thus, heretofore it has not possible to include non-volatile storage on a integrated circuit chip formed exclusively using standard CMOS processes.

SUMMARY

Accordingly, the present invention provides a non-volatile memory circuit which is fabricated using a standard sub 0.35 micron CMOS process. In one embodiment, the non-volatile memory circuit is fabricated using a standard 0.18 micron CMOS process. The core transistors fabricated in accordance with the 0.18 micron μm CMOS process have a gate oxide thickness of 40 Å, and are designed to operate in response to a nominal supply voltage of 1.8 Volts. The 0.18 micron CMOS process also provides for the fabrication of high voltage CMOS transistors that have a gate oxide thickness of 70 Å. These high voltage CMOS transistors are typically used in the input/output (I/O) circuitry of the integrated circuit chip.

The present invention includes a non-volatile memory cell that includes a low voltage CMOS storage transistor having a source region and a drain region that are commonly connected to ground. The low voltage storage transistor is programmed by applying a high programming voltage to its gate, thereby rupturing the gate oxide of the storage transistor. The high programming voltage is applied to the low voltage storage transistor through a high voltage p-channel transistor. The high voltage p-channel transistor has a thicker gate oxide than the storage transistor, thereby enabling the p-channel transistor to withstand higher voltages. Advantageously, the high voltage p-channel transistor has a higher breakdown voltage than a high voltage n-channel transistor having the same size. As a result, a relatively high programming voltage can be provided through the high voltage p-channel transistor, without damaging the p-channel transistor.

In one embodiment, the state of the low voltage storage transistor is read through the p-channel transistor. In another embodiment, the state of the low voltage storage transistor is read through a high voltage n-channel transistor.

The present invention also includes a decoder circuit for applying bit line and/or word line control voltages to a non-volatile memory cell. In accordance with one embodiment, the decoder circuit includes a first pair of high voltage p-channel transistors coupled in series between a programming voltage supply and the control line, and a second pair of high voltage p-channel transistors coupled in series between the $V_{CC}$ voltage supply and the control line. The first pair of high voltage p-channel transistors are turned on to couple the programming voltage to the control line, and the second pair of high voltage p-channel transistors are turned on to couple the $V_{CC}$ voltage supply to the control line. The relatively high breakdown voltages of the high voltage p-channel transistors advantageously prevent damage to these transistors during operation of the decoder circuit.

In one variation, the decoder circuit can additionally include a pair of high voltage n-channel transistors coupled in series between the control line and a ground voltage supply. In this variation, the pair of n-channel transistors are turned on to couple the ground voltage supply to the control line.

The present invention also includes a charge pump circuit for generating the high programming voltage in response to a clock signal (and the complement of the clock signal). In one embodiment, the charge pump circuit includes a first set of high voltage p-channel transistors connected to operate as capacitors, and a second set of high voltage p-channel transistors connected to operate as capacitors. During a first half cycle of the clock signal, the first set of capacitor-coupled p-channel transistors are charged, and the second set of capacitor-coupled p-channel transistors is discharged. During a second half cycle of the clock signal, the second set of capacitor-coupled p-channel transistors are charged, and the first set of capacitor-coupled p-channel transistors is discharged. The relatively high breakdown voltage of the capacitor-coupled p-channel transistors enables these transistors to withstand the high programming voltage generated by the charge pump circuit.

Another embodiment of the present invention includes a system-on-a-chip structure that implements the non-volatile memory of the present invention.

The present invention will be more fully understood in view of the following description and drawings.

DETAILED DESCRIPTION

Figure 1:
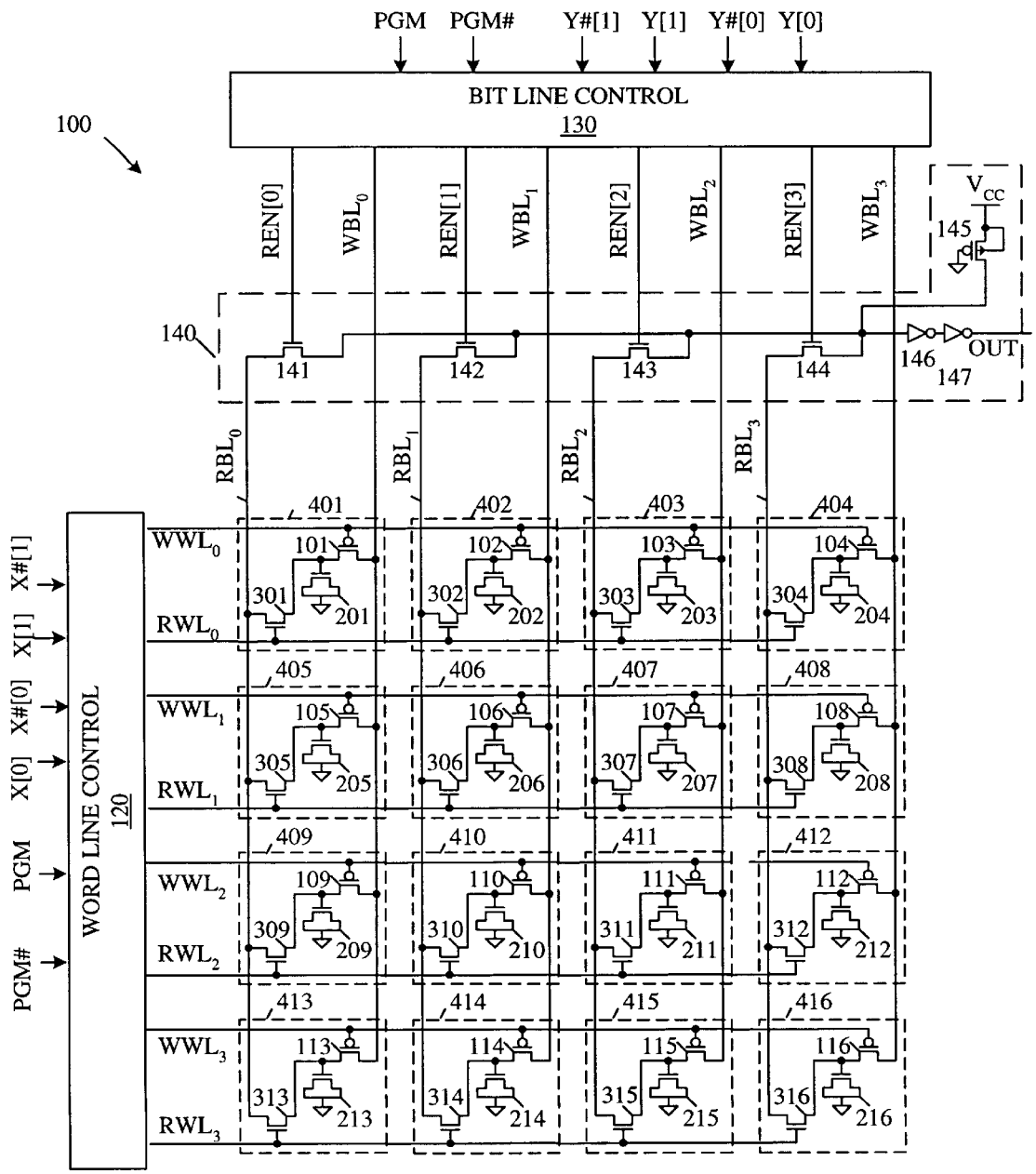
FIG. 1 is a schematic diagram of a memory system in accordance with one embodiment of the present invention.

FIG. 1 is a schematic diagram of a memory system 100 in accordance with one embodiment of this invention. Memory system 100 can be located on an integrated circuit chip with other circuitry, which is not shown in FIG. 1. This other circuitry can include, for example, circuitry relating to a field programmable gate array (FPGA). Memory system 100 is fabricated in accordance with a sub-0.35 $\mu$m technology.

In the described embodiment, memory system 100 is fabricated on an integrated circuit chip in accordance with a 0.18 $\mu$m CMOS process. The core transistors fabricated in accordance with the 0.18 $\mu$m CMOS process typically have a gate oxide thickness of 40 Å, and are designed to operate in response to a nominal supply voltage of 1.8 Volts. These transistors are hereinafter referred to as low voltage CMOS transistors.

The 0.18 $\mu$m CMOS process also provides for the fabrication of high voltage CMOS transistors that have a gate oxide thickness of 70 Å, and are designed to operate in response to a nominal supply voltage of 3.3 Volts. These high voltage CMOS transistors are typically used in the input/output (I/O) circuitry of the integrated circuit chip. This I/O circuitry provides an interface between the low voltage CMOS transistors, which form the core of the integrated circuit chip, and an external 3.3 Volt bus.

Memory system 100 includes a 4×4 array of memory cells 401–416, word line control circuit 120, bit line control circuit 130 and output circuit 140. Although the present invention is described as a 4×4 array, it is understood that arrays having other dimensions can be constructed in accordance with the teachings of the present specification. Memory cells 401–416 are formed by high voltage p-channel write access transistors 101–116, low voltage n-channel storage transistors 201–216, and high voltage n-channel read access transistors 301–316. Each of memory cells 401–416 includes a storage transistor, a read access transistor and a write access transistor. For example, memory cell 401 includes write access transistor 101, storage transistor 201 and read access transistor 301.

Figure 1A:
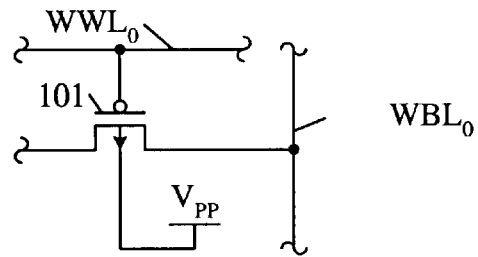
FIG. 1A is a schematic diagram of a high-voltage p-channel transistor used in the memory system of FIG. 1.

Storage transistors 201–216 are low voltage CMOS transistors having a gate oxide thickness of 40 Å, a channel width of 0.6 $\mu$m and a channel length of 0.25_m. Write access transistors 101–116 are high voltage p-channel CMOS transistors having a gate oxide thickness of 70 Å, a channel width of 1 $\mu$m and a channel length of 0.6_m. The wells of write access transistors 101–116 are coupled to receive a programming voltage $V_{PP}$. FIG. 1A is a schematic diagram illustrating the manner in which the substrate of write access transistor 101 in coupled to receive the programming voltage $V_{PP}$. It is understood that write access transistors 102–116 are coupled to receive the programming voltage $V_{PP}$ in the same manner as write access transistor 101. Read access transistors 301–316 are high voltage n-channel CMOS transistors having a gate oxide thickness of 70 Å, a channel width of 10 $\mu$m and a channel length of 0.6_m. All of these transistors 101–116, 201–216, 301–316 are fabricated in accordance with a conventional 0.18 $\mu$m CMOS process.

In general, the low voltage CMOS storage transistors 201–216 are programmed by destroying their gate oxide layers. When the gate oxide of a storage transistor is destroyed, a conductive path is formed between the gate and the source/drain regions of the storage transistor. If the gate oxide of a storage transistor is not destroyed, no such conductive path exists. The gate oxide layer of a storage transistor is destroyed by applying a high programming voltage ($V_{PP}$) across the gate oxide layer. To apply the high programming voltage $V_{PP}$ across the gate oxide layer of a storage transistor, the drain and source regions of the storage transistor are connected to ground, and a high programming voltage $V_{PP}$ is applied to the gate of the storage transistor.

In accordance with one aspect of the present invention, the high programming voltage $V_{PP}$ is applied to the gate of the storage transistor through a p-channel high voltage CMOS transistor. For example, storage transistor 201 is programmed by applying the high programming voltage $V_{PP}$ to the gate of storage transistor 201 through high voltage p-channel write access transistor 101. Advantageously, the breakdown voltage of p-channel high voltage CMOS transistor 101 is at least 1.5 Volts higher than the breakdown voltage of n-channel high voltage CMOS transistor 301. The high breakdown voltage of p-channel write access transistor 301 advantageously allows the use of a relatively high programming voltage $V_{PP}$. In the described embodiment, the programming voltage $V_{PP}$ is 8 Volts.

Figure 1B:
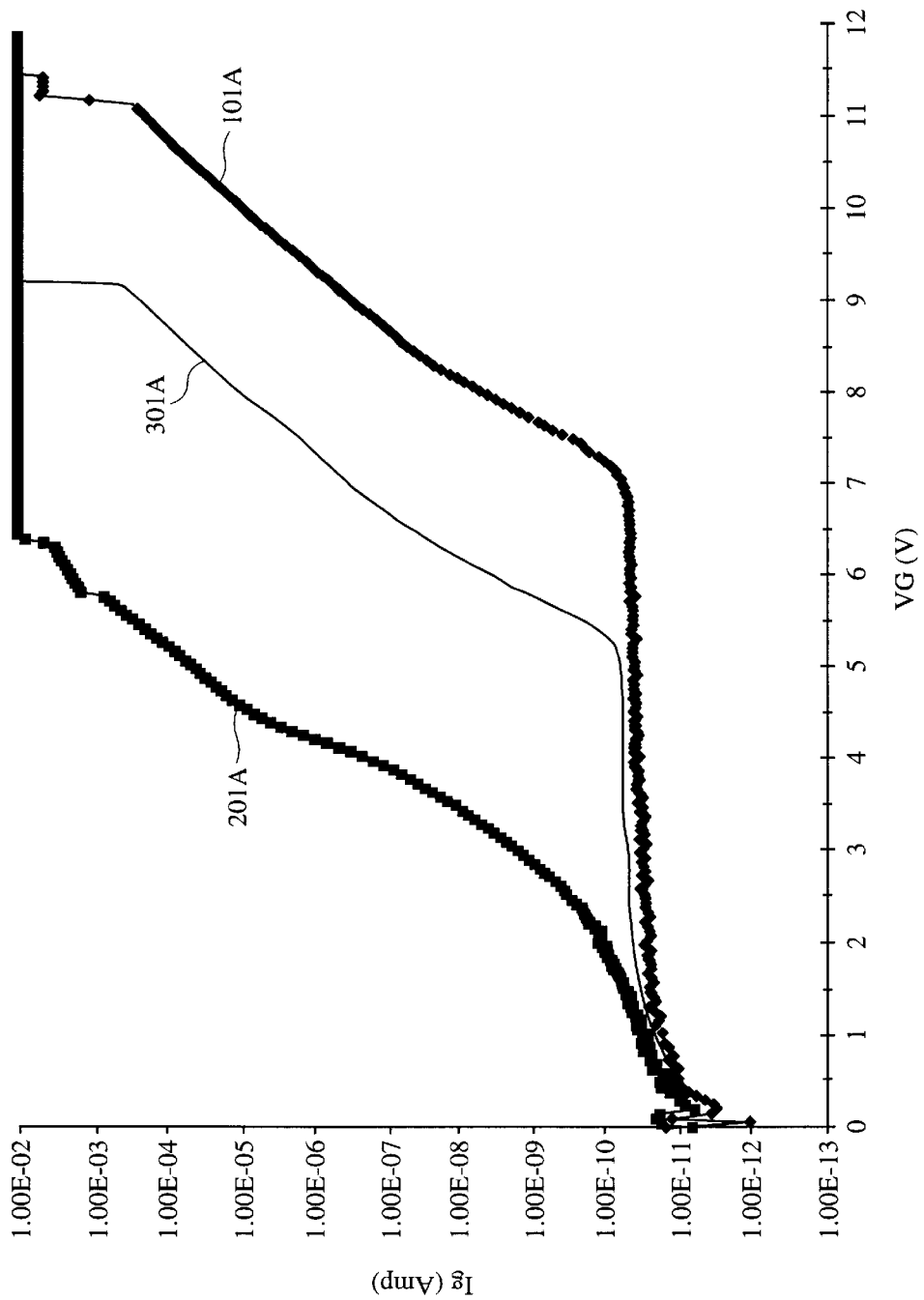
FIG. 1B is a graph of illustrating the breakdown characteristics of a low voltage n-channel transistor, a high voltage n-channel transistor, and a high voltage p-channel transistor.

FIG. 1B is a graph showing the breakdown characteristics of high voltage p-channel transistor 101, low voltage n-channel storage transistor 201 and high voltage n-channel transistor 301. The breakdown characteristics of transistors 101, 201 and 301 are shown by lines 101A, 201A and 301A, respectively. As illustrated by line 201A, low voltage n-channel transistor 201 has a breakdown voltage of about 6 Volts. However, at 6 Volts, high voltage n-channel transistor 301 operates in a Fowler-Nordheim tunneling region, which may be harmful to the gate oxide of this transistor 301. (The Fowler-Nordheim tunneling region begins at the knee of the curve.) As a result, it is undesirable to use the high voltage n-channel transistor 301 as a write access transistor. As illustrated by line 101A, high voltage p-channel transistor 101 does not begin to operate in the Fowler-Nordheim tunneling region until about 7.5 to 8 Volts. Advantageously, there is a safe operating margin that exists between the breakdown voltage of storage transistor 201, and the Fowler-Nordheim tunneling region of high voltage p-channel transistor 101. This margin enables high voltage p-channel transistor 101 to be used as a write access transistor.

In accordance with another aspect of the present invention, storage transistors 201–216 are read through high voltage n-channel read access transistors 301–316, respectively. For example, storage transistor 201 is read by turning on read access transistor 301. If storage transistor 201 is programmed, then the associated read bit line will be pulled down to about 0 Volts.

Memory system 100 will now be described in more detail by describing the operation of memory cell 401. As described above, memory cell 401 includes write access transistor 101, storage transistor 201 and read access transistor 301. The drain and source regions of storage transistor 201 are commonly connected to ground. The gate of storage transistor 201 is connected to the drain of write access transistor 101 and to the drain of read access transistor 301. The source of write access transistor 101 is coupled to receive a programming signal on write bit line $WBL_0$. The gate of write access transistor 101 is coupled to receive a write enable signal on write word line $WWL_0$. The gate of read access transistor 301 is coupled to receive a read enable signal on read word line $RWL_0$. The source of read access transistor 301 is coupled to read bit line $RBL_0$. Memory cells 402–416 are connected in a manner similar to memory cell 401. The memory cells in each row are coupled to a common write word line and a common read word line. For example, each of the memory cells in the third row is coupled to write word line $WWL_2$ and read word line $RWL_2$. Similarly, the memory cells in each column are coupled to the same read bit line and the same write bit line. For example, each of the memory cells in the fourth column is coupled to read bit line $RBL_3$ and write bit line $WBL_3$.

Word line control circuit 120 generates the read and write enable signals to be applied to read word lines $RWL_0$–$RWL_3$ and write word lines $WWL_0$–$WWL_3$ in response to row address signals X[1], X[0], X#[1] and X#[0] and the program enable signals PGM and PGM#. The symbol # is used to identify an inverted signal. Thus, signals X#[1] and X#[0] are the inverse of signals X[1] and X[0], respectively.

Bit line control circuit 130 generates the program signals to be applied to write bit lines $WBL_0$–$WBL_3$ in response to the column address signals Y[1], Y[0], Y#[1] and Y#[0] and the program enable signals PGM and PGM#.

Bit line control circuit 130 also generates read enable signals REN[0:3] in response to the column address signals Y[1], Y[0], Y#[1] and Y#[0] and the program enable signals PGM and PGM#. Read enable signals REN[0:3] are applied to the gates of read access transistors 141–144, respectively, in output circuit 140. The sources of read access transistors 141–144 are coupled to read bit lines $RBL_0$–$RBL_3$, respectively. The drains of read access transistors 141–144 are connected to the drain of p-channel pull-up transistor 145.

The gate of pull-up transistor 145 is coupled to ground, thereby turning on this transistor 145. Turned on transistor 145 tends to pull up the voltages on the drains of transistors 141–144 to the $V_{CC}$ supply voltage of 1.8 Volts. The drains of transistors 141–144 are also commonly connected to the input terminal of inverter 146. Inverter 146, in turn, is coupled to inverter 147, which provides output signal OUT.

Program Operation

The programming of memory system 100 will now be described in connection with the programming of memory cell 401. It is understood that the other memory cells 402–416 are programmed in a similar manner. The program signal PGM is asserted high (and PGM# is asserted low) to initiate the programming operation. At the same time, the row address signals X[1] and X[0] are both selected to have logic 101 values, thereby identifying the first row of the array, and the column address signals Y[1] and Y[0] are both selected to have logic '0' values, thereby identifying the first column of the array. Note that the second, third and fourth rows (or columns) are identified by address signals '01', '10' and '11', respectively.

Word line control circuit 120 asserts the supply voltage $V_{CC}$ on the write word line of the addressed row. Thus, in the described example, word line control circuit 120 asserts the supply voltage $V_{CC}$ of about 1.8 Volts on write word line $WWL_0$. Bit line control circuit 130 asserts the programming voltage $V_{PP}$ on the write bit line of the addressed column. Thus, in the described example, bit line control circuit 130 asserts the programming voltage $V_{PP}$ of about 8 Volts on write bit line $WBL_0$. Under these conditions, the high voltage p-channel transistor 101 turns on, thereby applying the high programming voltage $V_{PP}$ to the gate of low voltage storage transistor 201. Under these conditions, the gate oxide of low voltage storage transistor 201 is ruptured, thereby programming this transistor 201.

Bit line control circuit 130 provides the $V_{CC}$ supply voltage to all of the write bit lines in the non-addressed columns. Thus, in the present example, bit line control circuit 130 applies the $V_{CC}$ supply voltage of 1.8 Volts to write bit lines $WBL_1$–$WBL_3$. As a result, the gates and sources of the p-channel transistors 102–104 in the addressed row are held at the same voltage (1.8 Volts). Consequently, the p-channel transistors 102–104 in the addressed row are turned off, and the associated storage transistors 202–204 are not programmed.

Word line control circuit 120 further provides the programming voltage $V_{PP}$ on the write word lines of the non-addressed rows. In the present example, word line control circuit 120 applies the programming voltage $V_{PP}$ of 8 Volts to write word lines $WWL_1$–$WWL_3$. As a result, the gates and the sources of the p-channel transistors 105, 109 and 113 in the addressed column are held at the same voltage ($V_{PP}$). Consequently, the p-channel transistors 105, 109 and 113 in the addressed row are turned off, and the associated storage transistors 205, 209 and 213 are not programmed.

Similarly, the gates of the p-channel write access transistors 106–108, 110–112 and 114–116 in the non-addressed rows and columns are held at the programming voltage of $V_{PP}$, while the sources of these p-channel transistors are held at the $V_{CC}$ supply voltage. Because the gate voltages are greater than the source voltages, these p-channel transistors are turned off, and the associated storage transistors 206–208, 210–212 and 214–216 are not programmed.

Word line control circuit 120 further applies the $V_{CC}$ supply voltage to all of the read word lines $RWL_0$–$RWL_3$. As a result, the gate-to-drain voltage of the high voltage n-channel read access transistor in the programmed memory cell is limited to a voltage that does not exceed the programming voltage $V_{PP}$ minus the $V_{CC}$ supply voltage. Note that this voltage is only applied until the programming operation is complete (i.e., the gate oxide is ruptured. At this time the gate-to-drain voltage drops to 1.8 Volts. Consequently, the gate oxides of read access transistors 301–316 are not damaged during a programming operation.

Bit line control circuit 130 further provides read enable signals REN[0:3] having a voltage of 0 Volts during a program operation. Consequently, read output transistors 141–144 are not turned on during a programming operation. As a result, read bit lines $RBL_0$–$RBL_3$ are left floating.

Table 1 summarizes the various voltages applied to the addressed and non-addressed rows and columns during a program operation.

TABLE 1

|  | Addressed Row | Non-Addressed Row | Addressed Column | Non-Addressed Column |
|---|---|---|---|---|
| WWL | 1.8 V | 8 V | — | — |
| RWL | 1.8 V | 1.8 V | — | — |
| WBL | — | — | 8 V | 1.8 V |
| REN | — | — | 0 V | 0 V |
| RWL | — | — | Float | Float |

Read Operation

The reading of memory system 100 will now be described in connection with a read operation of memory cell 401. It is understood that the other memory cells 402–416 are read in a similar manner. The program signal PGM is de-asserted low (and PGM# is de-asserted high) to initiate the read operation. At the same time, the row address signals X[1] and X[0] are both selected to have logic '0' values, thereby identifying the first row of the array, and the column address signals Y[1] and Y[0] are both selected to have logic '0' values, thereby identifying the first column of the array. Note that the second, third and fourth rows (or columns) are identified by address signals '01', '10' and '11', respectively.

Word line control circuit 120 asserts the supply voltage $V_{CC}$ on the read word line of the addressed row. Thus, in the described example, word line control circuit 120 asserts the supply voltage $V_{CC}$ of about 1.8 Volts on read word line $RWL_0$. Under these conditions, n-channel read access transistor 301 turns on, thereby coupling the gate of storage transistor 201 to read bit line $RBL_0$. Bit line control circuit 130 asserts the read enable signal REN associated with the addressed column at the $V_{CC}$ supply voltage. Thus, in the described example, bit line control circuit 130 asserts the read enable signal REN[0] at the $V_{CC}$ supply voltage of 1.8 Volts. Under these conditions, n-channel read access transistor 141 turns on, thereby coupling the read bit line $RBL_0$ to the drain of p-channel output transistor 145.

If storage transistor 201 is programmed, a conductive path will exist through storage transistor 201. Under these conditions, storage transistor 201 will pull down the voltage on read bit line $RBL_0$ to a voltage that is less than the threshold voltage of inverter 146. As a result, inverter 147 provides a logic low output signal OUT.

Conversely, if storage transistor 201 is not programmed, no conductive path exists through storage transistor 201. Under these conditions, p-channel output transistor 145 pulls the voltage of read bit line $RBL_0$ up to a voltage which is greater than the threshold voltage of inverter 146. As a result, inverter 147 provides a logic high output signal OUT.

Word line control circuit 120 provides 0 Volts to all of the row word lines in the non-addressed rows. Thus, in the present example, word line control circuit 120 provides 0 Volts to read word lines $RWL_1$–$RWL_3$. As a result, read access transistors 405–416 are turned off, thereby preventing memory cells 405–416 from being read.

Bit line control circuit 130 provides read enable signals REN of 0 Volts to the non-addressed columns. Thus, in the present example, bit line control circuit 130 provides read enable signals REN[1:3] of 0 Volts. As a result, transistors 142–144 are turned off, thereby leaving read bit lines $RBL_1$–$RBL_3$ floating.

Word line control circuit 120 further provides the $V_{CC}$ supply voltage to all of the write word lines $WWL_0$–$WL_3$. Bit line control circuit 130 further provides 0 Volts to all of the write bit lines $WBL_0$–$WBL_3$. As a result, all of the p-channel access transistors 101–116 are turned off during a read operation.

Table 2 summarizes the various voltages applied to the addressed and non-addressed rows and columns during a read operation.

TABLE 2

|  | Addressed Row | Non-Addressed Row | Addressed Column | Non-Addressed Column |
|---|---|---|---|---|
| WWL | 1.8 V | 1.8 V | — | — |
| RWL | 1.8 V | 0 V | — | — |
| WBL | — | — | 0 V | 0 V |
| REN | — | — | $V_{cc}$ | 0 V |
| RWL | — | — | Coupled to Output Devices 145–147 | Float |

Figure 2:
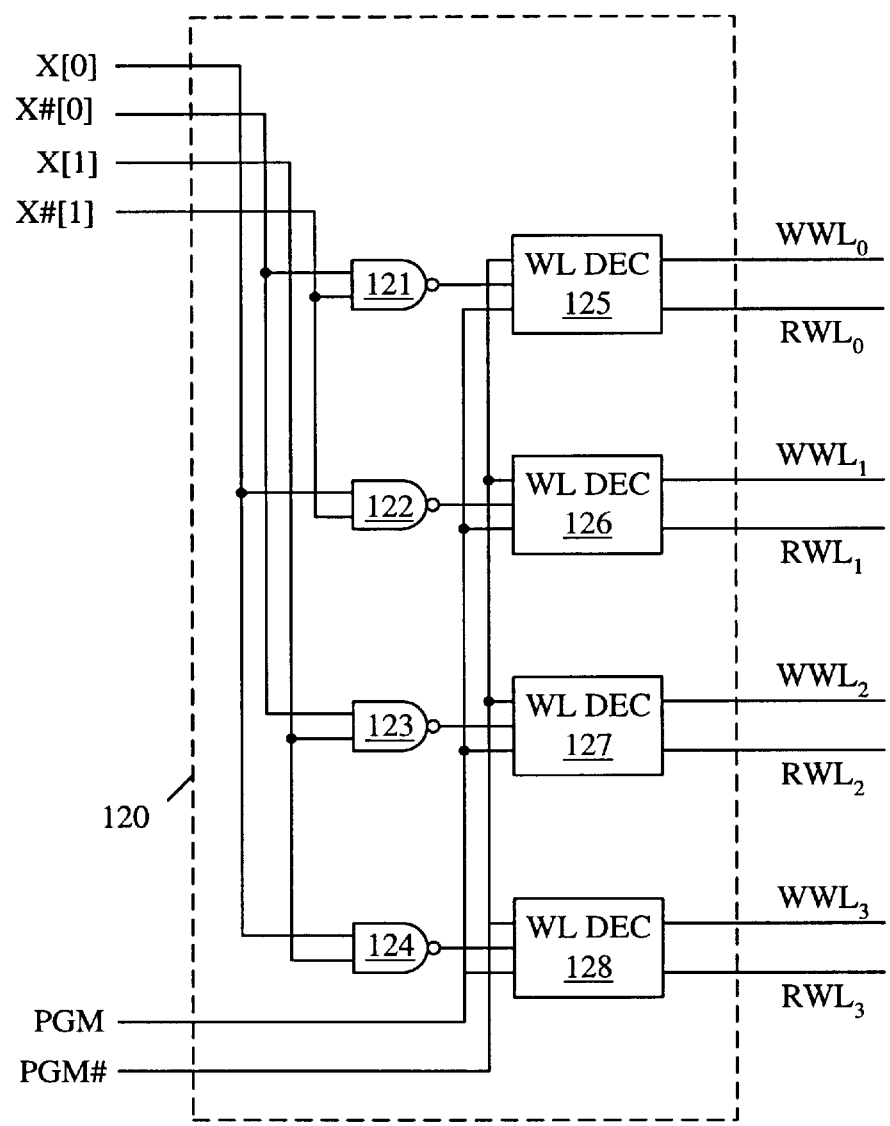
FIG. 2 is a block diagram of word line control circuit 120 in accordance with one embodiment of the present invention; of FIG. 3 is a schematic diagram of a word line decoder in accordance with one embodiment of the present invention.

FIG. 2 is a block diagram of word line control circuit 120 in accordance with one embodiment of the present invention. Word line control circuit 120 includes logical NAND gates 121–124 and word line decoders 125–128. NAND gates 121–124 are coupled to receive the row address signals X[1], X[0], X#[1] and X#[0], as illustrated. There are four possible combinations of the row address signals. NAND gates 121–24 decode these four combinations. For example, when the row address signals X[1:0] have a value of '00' (and row address signals X#[1:0] have a value of '11'), NAND gate 121 asserts a logic low output signal, while NAND gates 122–124 each de-assert a logic high output signal.

Word line decoders 125–128 are coupled to receive the output signals provided by NAND gates 121–124, respectively. Each of word line decoders 125–128 is also coupled to receive the program enable signals PGM and PGM#. In response, word line decoders 125–128 generate the word line control signals for read word lines $RWL_0$–$RWL_3$ and write word lines $WWL_0$–$WWL_3$ in the manner described above.

Figure 3:
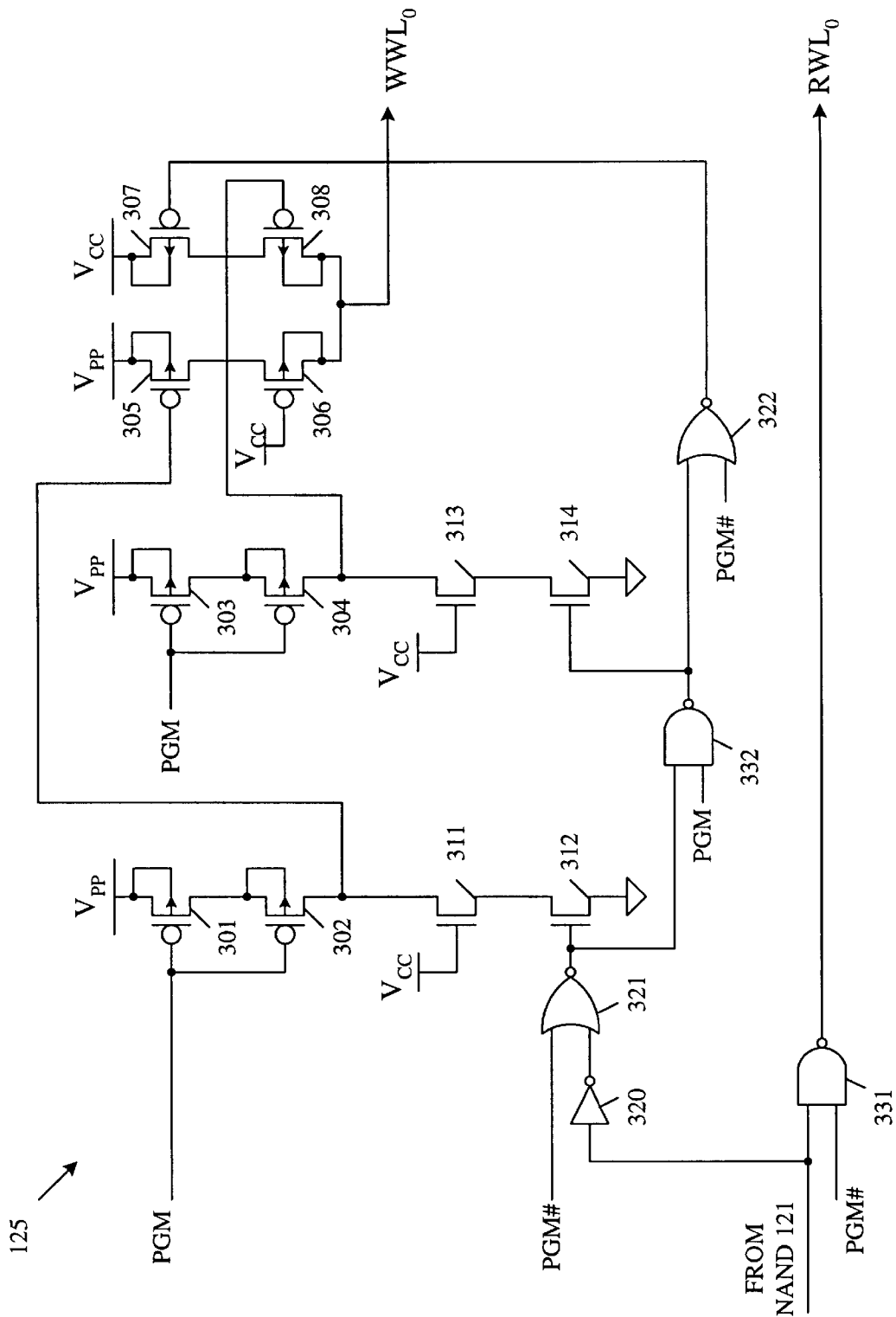

FIG. 3 is a schematic diagram of word line decoder 125. In the present embodiment, word line decoders 126–128 are identical to word line decoder 125. Word line decoder 125 includes high voltage p-channel transistors 301–308, high voltage n-channel transistors 311–314, inverter 320, NOR gates 321–322 and NAND gates 331–332. Inverter 320, NOR gates 321–322 and NAND gates 331–332 are constructed with low voltage p-channel and n-channel transistors in a manner known to those of ordinary skill in the art. Table 3 lists the width-to-length (W/L) dimensions of transistors 301–308 and 311–314 in accordance with the described embodiment.

TABLE 3

| Transistor(s) | W/L Dimensions (microns) |
| --- | --- |
| 301, 303 | 2/0.6 |
| 302, 304 | 8/0.6 |
| 305, 306, 307, 308 | 10/0.6 |
| 311 | 2/0.6 |
| 312 | 2/0.35 |
| 313 | 4/0.6 |
| 314 | 4/0.35 |

Word line decoder 125 operates as follows:

Word Line Decoder—Program Mode

In the programming mode, the PGM# signal has a logic low value, thereby causing NAND gate 331 to provide a logic high signal of 1.8 Volts ($V_{CC}$) on row word line $RWL_0$. Note that all of the other row word lines $RWL_1$–$RWL_3$ receive a 1.8 Volt signal in response to the logic low PGM# signal.

Word line decoder 125 includes two high voltage inverters. The first inverter is constructed with two thick oxide p-channel transistors 301–302 and two thick oxide n-channel transistors 311–312 connected in series. The gate of n-channel transistor 311 is connected to receive the $V_{CC}$ supply voltage of 1.8 Volts, thereby protecting transistor 311 when the drain is pulled up to a high voltage of 8 Volts. The signal from NAND gate 121 is routed to the gate of n-channel transistor 312 (with two inversions) through inverter 320 and NOR gate 321. If the first row is addressed during the programming operation, the gate of n-channel transistor 312 receives a logic low signal, thereby turning off this transistor 312. In the programming mode, the PGM signal is 1.8 Volts and the programming voltage $V_{PP}$ is 8 Volts. As a result, p-channel transistors 301 and 302 are turned on, thereby providing the programming voltage $V_{PP}$ of 8 Volts at the output of the first high voltage inverter (i.e., to the gate of p-channel transistor 305).

If the first row is not addressed during the programming operation, the gate of n-channel transistor 312 receives a logic high signal, thereby causing this transistor 312 to turn on. Under these conditions, the first high voltage inverter provides a logic low output signal. Under these conditions, there is a steady current flowing through transistors 301–302 and 311–312. Thus, the output voltage is decided by the ratio of these transistors. In the described embodiment, transistors 301–302 and 311–312 are selected such that the output voltage is around 2 Volts.

When the first high voltage inverter provides a logic high output voltage of $V_{PP}$, the source/drain voltages of transistors 301 and 302 are 8 Volts ($V_{PP}$), and the gate voltages of transistors 301 and 302 are 1.8 Volts. When the first high voltage inverter provides a logic low output voltage of 2 Volts, the programming voltage $V_{PP}$ of 8 volts is shared by p-channel transistors 301 and 302, thereby avoiding high drain-source voltages ($V_{DS}$) for either one of these transistors.

The second high voltage inverter, which is formed by p-channel transistors 303–304 and n-channel transistors 313–314, is substantially identical to the first high voltage inverter. The input signal provided to the gate of n-channel transistor 314 is the complement of the input signal provided to the gate of n-channel transistor 312. (NAND gate 332 operates to invert the input signal provided to the gate of n-channel transistor 312). As a result, the second high voltage inverter provides a logic low output signal (2 Volts) if the first row is addressed, and provides a logic high output signal (8 Volts) if the first row is not addressed.

The output signals provided by the first and second high voltage inverters are provided to a high voltage switch that includes four high voltage p-channel transistors 305–308. The gate of p-channel transistor 306 is connected to the $V_{CC}$ supply voltage, thereby causing transistor 306 to turn on when transistor 305 is turned on, and causing transistor 306 to turn off when transistor 305 is turned off. P-channel transistor 306 is thereby protected under these conditions. The input signal provided to the gate of p-channel transistor 307 is generated with low voltage logic gates (i.e., NOR gate 322). If the first row is the addressed row, the gate of p-channel transistor 307 receives an input signal of 0 Volts. Conversely, if the first row is not the addressed row, the gate of p-channel transistor 307 receives an input signal of 1.8 Volts.

To summarize, if the first row is the addressed row, then the gate of p-channel transistor 305 receives 8 Volts, the gate of p-channel transistor 308 receives 2 Volts, and the gate of p-channel transistor 307 receives 0 Volts, and the gate of p-channel transistor 306 receives 1.8 Volts. Under these conditions, transistors 307 and 308 turn on, thereby providing the $V_{CC}$ supply voltage (1.8 Volts) to write word line $WWL_0$.

If the first row is not the addressed row, then the gate of p-channel transistor 305 receives 2 Volts, the gate of p-channel transistor 308 receives 8 Volts, and the gate of p-channel transistor 307 receives 1.8 Volts, and the gate of p-channel transistor 306 receives 1.8 Volts. Under these conditions, transistors 305 and 306 turn on, thereby providing the programming voltage $V_{PP}$ (8 Volts) to write word line $WWL_0$.

Word Line Decoder—Read Mode

In the read mode, the PGM signal has a logic low value and the PGM# signal has a logic high value. As a result, the gate of transistor 312 receives a logic low signal, and the gate of transistor 314 receives a logic high signal. Under these conditions, the first high voltage inverter provides the programming voltage $V_{PP}$ to the gate of p-channel transistor 305, thereby turning off this transistor 305. The second high voltage inverter provides a logic low voltage (about 2 Volts) to the gate of p-channel transistor 308. In addition, NOR gate 322 provides a logic low signal (0 Volts) to the gate of p-channel transistor 307. Under these conditions, p-channel transistors 307~ and 308 turn on, thereby providing 1.8 Volts to write word line $WWL_0$ (regardless of the input signal received from NAND gate 121).

Also during the read mode, NAND gate 331 provides a signal on read word line $RWL_0$ in response to the signal received from NAND gate 121. If the first row is the addressed row, NAND gate 121 provides a logic low signal to NAND gate 331. In response, NAND gate 331 provides a 1.8 Volt signal to read word line $RWL_0$. If the first row is not the addressed row, NAND gate 121 provides a logic high signal to NAND gate 331. In response, NAND gate 331 provides a 0 Volt signal to read word line $RWL_0$.

Figure 4:
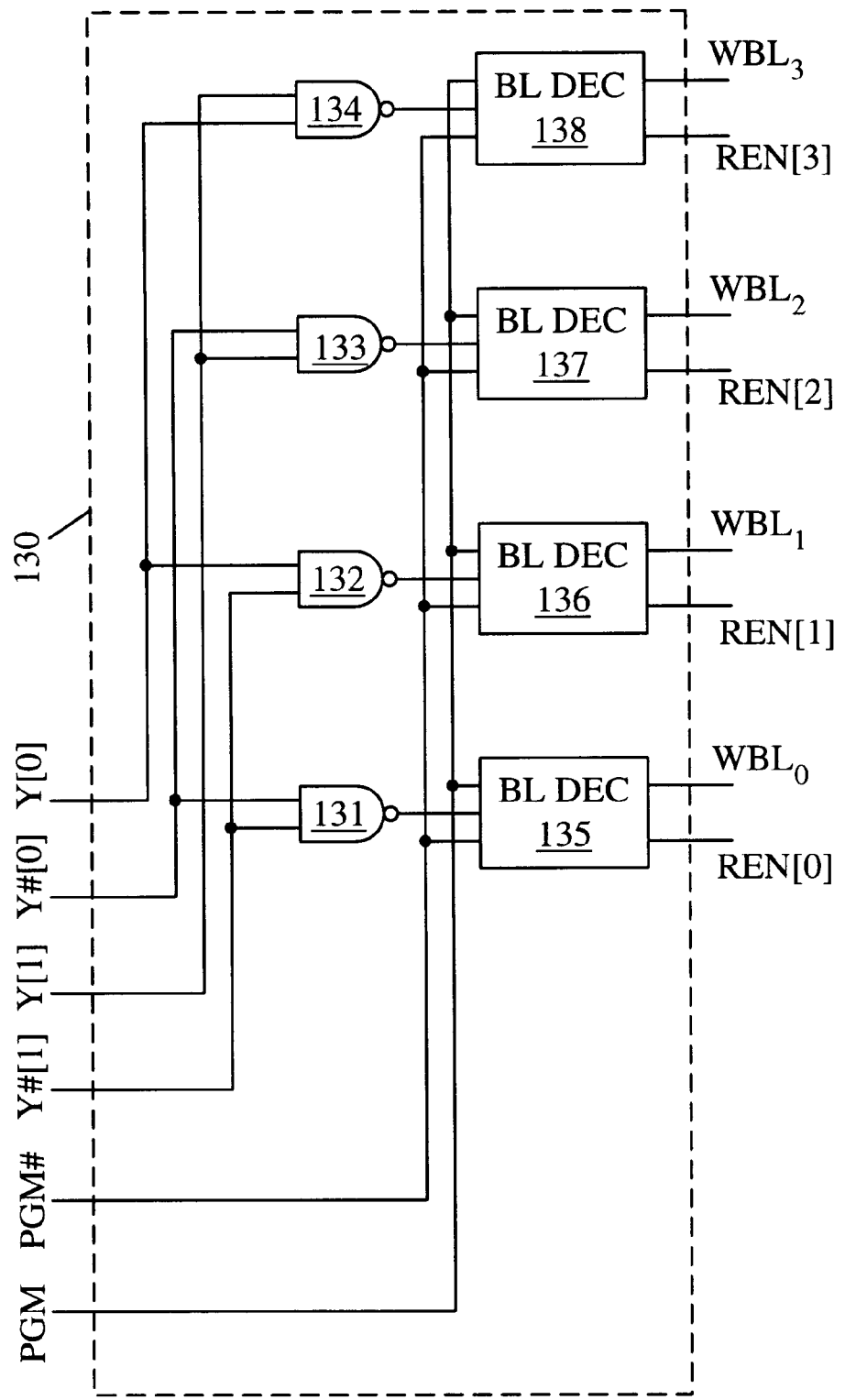
FIG. 4 is a block diagram of a bit line control circuit in accordance with one embodiment of the present invention.

FIG. 4 is a block diagram of bit line control circuit 130. Bit line control circuit 130 includes logical NAND gates 131–134 and bit line decoders 135–138. NAND gates 131–134 are coupled to receive the column address signals Y[1], Y[0], Y#[1] and Y#[0], as illustrated. There are four possible combinations of the column address signals. NAND gates 131–134 decode these four combinations. For example, when the column address signals Y[1:0] have a value of '00' (and Y#[1:0] have a value of '11'), NAND gate 131 asserts a logic low output signal, while NAND gates 132–134 each de-assert a logic high output signal.

Bit line decoders 135–138 are coupled to receive the output signals provided by NAND gates 131–134, respectively. Each of bit line decoders 135–138 is also coupled to receive the program enable signals PGM and PGM#. In response, bit line decoders 135–138 generate the control signals for write bit lines $WBL_0$–$WBL_3$ and the read enable signals REN[0:3] in the manner described above.

Figure 5:
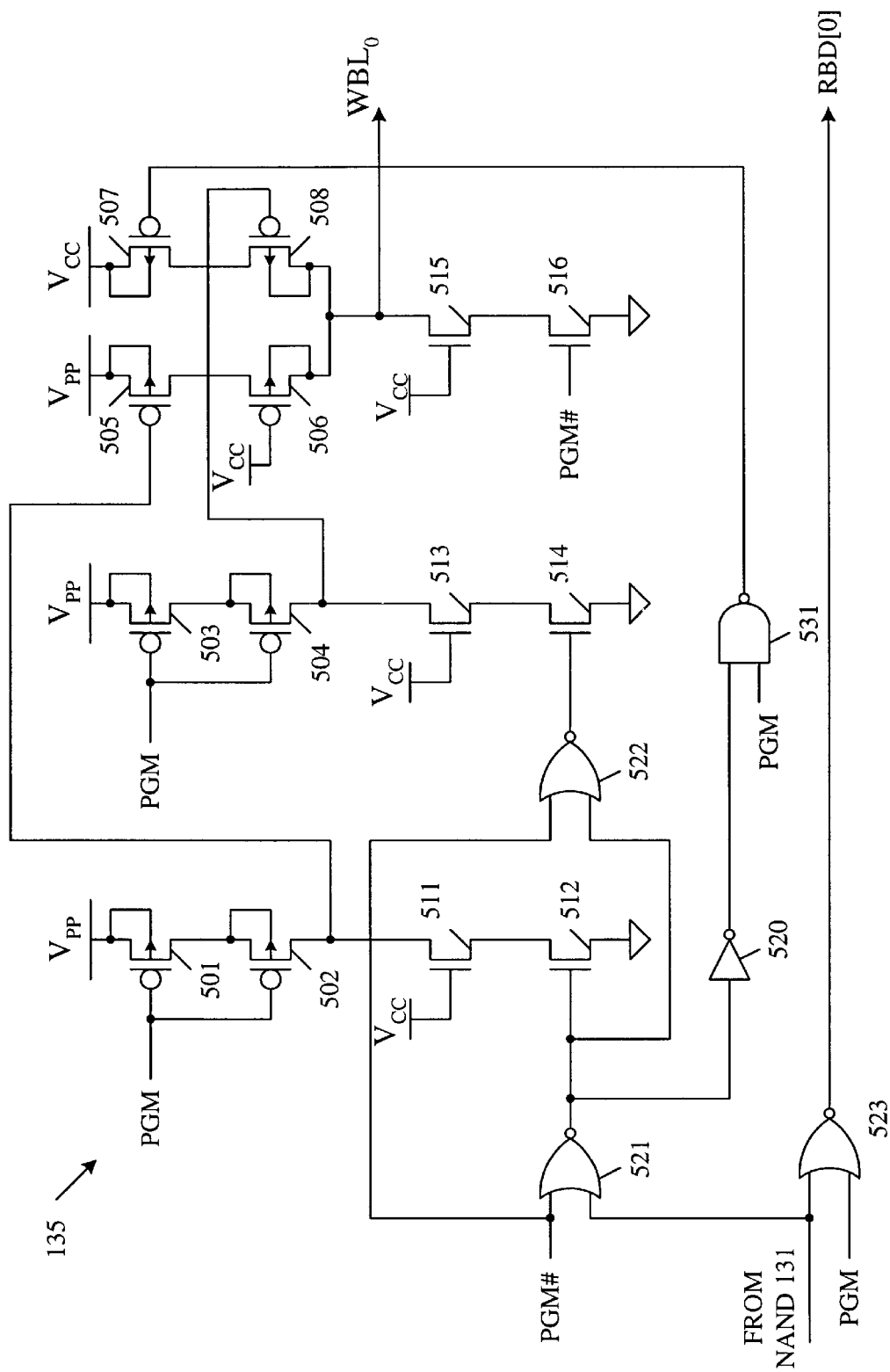
FIG. 5 is a schematic diagram of a bit line decoder in accordance with one embodiment of the present invention.

FIG. 5 is a schematic diagram of bit line decoder 135. In the present embodiment, bit line decoders 136–138 are identical to bit line decoder 135. Bit line decoder 135 includes high voltage p-channel transistors 501–508, high voltage n-channel transistors 511–516, inverter 520, NOR gates 521–523 and NAND gate 531. Inverter 520, NOR gates 521–523 and NAND gate 531 are constructed with low voltage p-channel and n-channel transistors in a manner known to those of ordinary skill in the art. Table 4 lists the width-to-length (W/L) dimensions of transistors 501–508 and 511–516 in accordance with the described embodiment.

TABLE 4

| Transistor(s) | W/L Dimensions (microns) |
| --- | --- |
| 501, 503 | 2/0.6 |
| 502, 504 | 8/0.6 |
| 505, 506, 507, 508 | 10/0.6 |
| 511, 513, 515 | 4/0.6 |
| 512, 514, 516 | 4/0.35 |

Bit line decoder 135 operates as follows. Transistors 501–508 and 511–514 of bit line decoder 135 are connected in the same manner as transistors 301–308 and 311–314 of word line decoder 125 (FIG. 3). Thus, transistors 501–508 and 511–514 operate in the same manner described above for transistors 301–308 and 311–314.

Bit Line Decoder—Program Mode

In the programming mode, the PGM signal has a logic high value, thereby causing NOR gate 523 to provide a logic low read enable signal REN[0] of 0 Volts. Note that all of the other read enable signals REN[1:3] are similarly at 0 Volts during the programming mode.

If the first column is the addressed column, then NAND gate 131 will provide a logic low input signal to NOR gate 521. In response, NOR gate 521 provides a logic high signal to the gate of n-channel transistor 512, thereby turning on this transistor and causing a low voltage (2 Volts) to be applied to the gate of p-channel transistor 505. The logic high signal provided by NOR gate 521 is also provided to NOR gate 522. In response, NOR gate 522 provides a logic low signal to the gate of n-channel transistor 514, thereby turning off this transistor and causing the programming voltage $V_{PP}$ to be applied to the gate of p-channel transistor 508.

The logic high signal provided by NOR gate 521 is also routed through inverter 520 to NAND gate 531. In response, NAND gate 531 provides a logic high signal (1.8 Volts) to the gate of p-channel transistor 507. Under these conditions, p-channel transistors 505 and 506 are turned on, thereby providing the programming voltage $V_{PP}$ to write bit line $WBL_0$. Note that transistors 507–508 and 516 are turned off under these conditions.

If the first column is not the addressed column, then NAND gate 131 will provide a logic high input signal to NOR gate 521. In response, NOR gate 521 provides a logic low signal, which turns off n-channel transistor 512 and turns on n-channel transistor 514. As a result, a low voltage (2 Volts) is applied to the gate of p-channel transistor 508, and the programming voltage $V_{PP}$ is applied to the gate of p-channel transistor 505. The logic low signal provided by NOR gate 521 also causes NAND gate 531 to provide a logic low signal (0 Volts) to the gate of p-channel transistor 507. Under these conditions, p-channel transistors 507 and 508 are turned on, thereby providing the $V_{CC}$ supply voltage to write bit line $WBL_0$. Note that transistors 505–506 and 516 are turned off under these conditions.

Bit Line Decoder—Read Mode

In the read mode, the PGM# signal has a logic high value, thereby turning on n-channel transistor 516. As a result, write bit line $WBL_0$ is pulled down to 0 Volts.

If the first column is the addressed column, then NOR gate 523 receives a logic low signal from NAND gate 131. The PGM signal also has a logic low value at this time, thereby causing NOR gate 523 to provide a logic high read enable signal REN[0].

If the first column is not the addressed column, then NOR gate 523 receives a logic high signal from NAND gate 131. In response, NOR gate 523 provides a logic low read enable signal REN[0].

Second Embodiment

Figure 6:
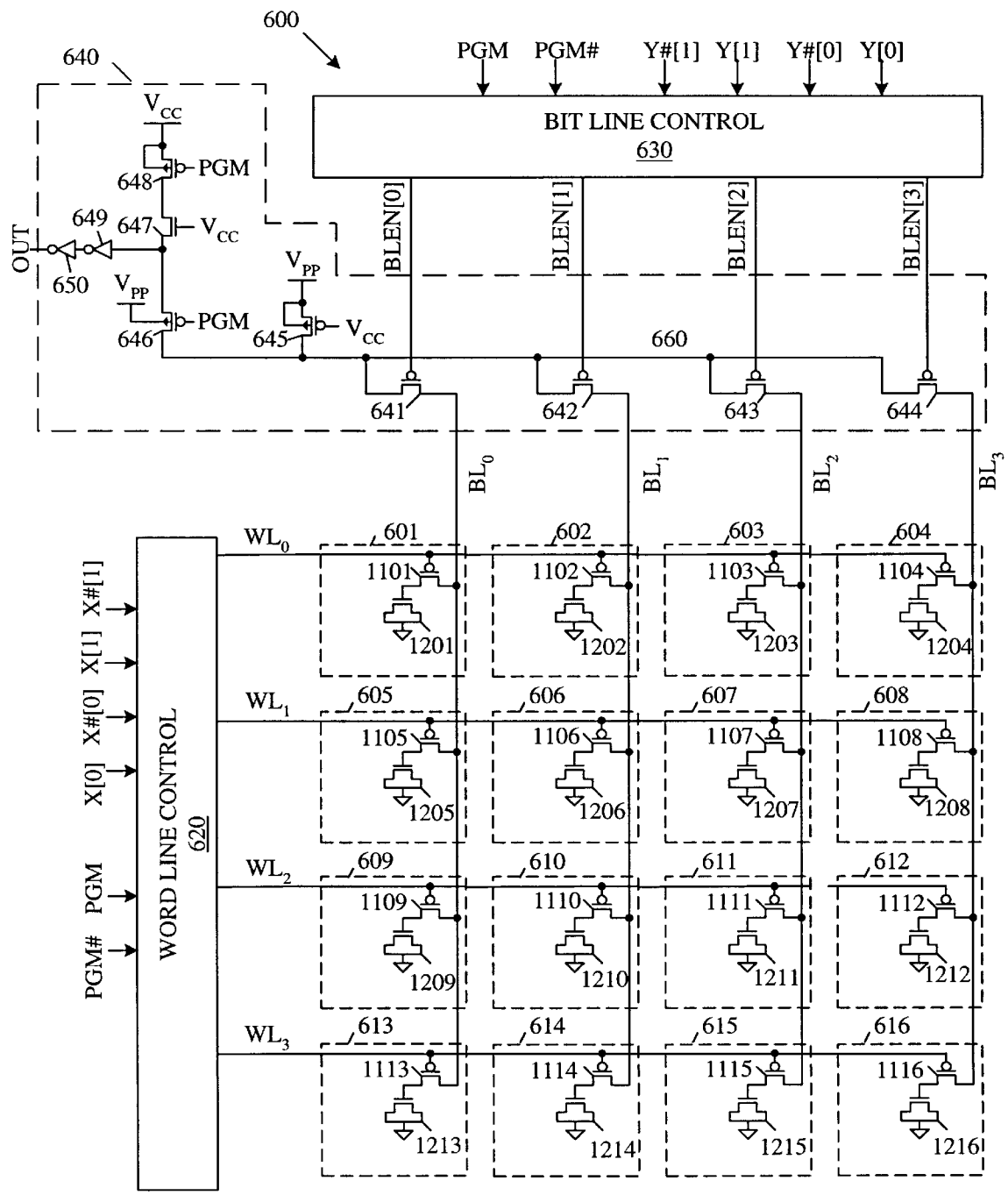
FIG. 6 is a schematic diagram of a memory system in accordance with another embodiment of the present invention.

FIG. 6 is a schematic diagram of a memory system 600 in accordance with another embodiment of the present invention. In the described embodiment, memory system 600 is fabricated on an integrated circuit chip in accordance with a 0.18 µm CMOS process.

Memory system 600 includes a 4×4 array of memory cells 601–616, word line control circuit 620, bit line control circuit 630 and output circuit 640. Although the present invention is described as a 4×4 array, it is understood that arrays having other dimensions can be constructed in accordance with the teachings of the present specification. Memory cells 601–616 are formed by high voltage p-channel access transistors 1101–1116 and low voltage n-channel storage transistors 1201–1216. Each of memory cells 601–616 includes a storage transistor and an access transistor. For example, memory cell 601 includes access transistor 1101 and storage transistor 1201.

Storage transistors 1201–1216 are low voltage CMOS transistors similar to above-described storage transistors 201–216 (FIG. 1). Each of storage transistors 1201–1216 has a gate oxide thickness of 40 Å, a channel width of 0.65 µm and a channel length of 0.25 µm. Access transistors 1101–1116 are high voltage p-channel CMOS transistors having a gate oxide thickness of 70 Å, a channel width of 20 µm and a channel length of 0.7 µm. The wells of access transistors 1101–1116 are coupled to receive the programming voltage $V_{PP}$. Note that access transistors 1101–1116 are significantly larger than write access transistors 101–116 (FIG. 6). All of these transistors 1101–1116, 1201–1216 are fabricated in accordance with a conventional 0.18 µm CMOS process.

The low voltage CMOS storage transistors 1201–1216 are programmed by destroying the gate oxide layers of these transistors. Transistors 1201–1216 are programmed in a manner similar to transistors 201–216 of memory system 100 (FIG. 1). Thus, a high programming voltage $V_{PP}$ is applied to the gate of a storage transistor through its corresponding p-channel access transistor. Again, the breakdown voltage of the p-channel access transistor is at least 1.5 Volts higher than the breakdown voltage of an n-channel access transistor of similar size. The high breakdown voltage of the p-channel access transistor advantageously allows the use of a relatively high programming voltage $V_{PP}$. In the described embodiment, the programming voltage $V_{PP}$ is 8 Volts.

Storage transistors 1201–1216 are also read through high voltage p-channel access transistors 1101–1116, respectively. For example, storage transistor 1201 is read through access transistor 1101.

Memory system 600 will now be described in more detail by describing the operation of memory cell 601. Word line control circuit 620 generates the word line enable signals to be applied to word lines $WL_0-WL_3$ in response to row address signals X[1], X[0], X#[1] and X#[0] and the program enable signals PGM and PGM#. Similarly, bit line control circuit 630 generates the bit line enable signals BLEN[0:3] in response to the column address signals Y[1], Y[0], Y#[1] and Y#[0] and the program enable signals PGM and PGM#. Bit line enable signals BLEN[0:3] are applied to the gates of bit line access transistors 641–644, respectively. The sources of bit line access transistors 641–644 are coupled to bit lines $BL_0-BL_3$, respectively. The drains of bit line access transistors 641–644 are commonly connected to line 660. Line 660 is coupled to the drain of p-channel programming transistor 645. The gate of programming transistor 645 is coupled to receive the $V_{CC}$ supply voltage of 1.8 Volts, and the source of programming transistor 645 is coupled to receive the programming voltage $V_{PP}$. Programming voltage $V_{PP}$ is selected to have a voltage of 8 Volts during a programming operation, and a voltage of 1.8 Volts otherwise.

Line 660 is also coupled to the drain of p-channel output transistor 646. The gate of output transistor 646 is coupled to receive the PGM signal, and the source of transistor 646 is coupled to the output buffer formed by inverters 649 and 650. P-channel output transistor 648 and n-channel output transistor 647 are connected in series between the $V_{CC}$ voltage supply and the source of transistor 646. The gate of p-channel output transistor 648 is coupled to receive the PGM signal, and the gate of n-channel output transistor 647 is coupled to receive the $V_{CC}$ supply voltage.

Program Operation

The programming of memory system 600 will now be described in connection with the programming of memory cell 601. It is understood that the other memory cells 602–616 are programmed in a similar manner. The program signal PGM is asserted high (and PGM# is asserted low) to initiate the programming operation. The high PGM signal turns off p-channel output transistors 646 and 648. At the same time, the programming voltage $V_{PP}$ is increased to 8 Volts. Under these conditions, programming transistor 645 turns on, thereby applying the programming voltage $V_{PP}$ to line 660.

The row address signals X[1] and X[0] are both selected to have logic '0' values, thereby identifying the first row, and the column address signals Y[1] and Y[0] are both selected to have logic '0' values, thereby identifying the first column. Bit line control circuit 630 asserts a logic low bit line enable signal to turn on the bit line access transistor in the addressed column. Thus, in the described example, bit line control circuit 630 asserts a logic low bit line enable signal BLEN [0], thereby turning on bit line access transistor 641. As a result, the programming voltage $V_{PP}$ is transferred to the bit line $BL_0$ of the addressed column.

Bit line control circuit 630 is also controlled to provide the programming voltage $V_{PP}$ to all of the bit line access transistors in the non-addressed columns. Thus, in the present example, bit line control circuit 630 applies the programming voltage $V_{PP}$ of 8 Volts to bit line access transistors 642–644. Under these conditions, these bit line access transistors 642–644 are turned off, thereby leaving the associated bit lines $BL_1-BL_3$ floating.

Word line control circuit 620 asserts the $V_{CC}$ supply voltage on the word line of the addressed row. Thus, in the described example, word line control circuit 620 asserts the $V_{CC}$ supply voltage of about 1.8 Volts on word line $WL_0$. Under these conditions, p-channel access transistor 1101 turns on, thereby applying the programming voltage $V_{PP}$ to the gate of storage transistor 1201, thereby rupturing the gate oxide of low voltage storage transistor 1201.

Word line control circuit 620 is further controlled to provide the programming voltage $V_{PP}$ to all of the word lines in the non-addressed rows. Thus, in the present example, word line control circuit 620 applies the programming voltage $V_{PP}$ of 8 Volts to word lines $WL_1-WL_3$. As a result, access transistors 1105, 1109 and 1113 are not turned on by the programming voltage $V_{PP}$ applied to bit line $BL_0$. Consequently, storage transistors 1205, 1209 and 1213 are not programmed.

Table 5 summarizes the various voltages applied to the addressed and non-addressed rows and columns during a program operation.

TABLE 5

|  | Addressed Row | Non-Addressed Row | Addressed Column | Non-Addressed Column |
| --- | --- | --- | --- | --- |
| WL | 1.8 V | 8 V | — | — |
| BLEN | — | — | 1.8 V | 8 V |
| BL | — | — | 8 V | Float |

Read Operation

The reading of memory system 600 will now be described in connection with a read operation of memory cell 601. It is understood that the other memory cells 602–616 are read in a similar manner. The program signal PGM is de-asserted low (and PGM# is de-asserted high) to initiate the read operation. In response, p-channel output transistors 646 and 648 are turned on. At the same time, the programming voltage $V_{PP}$ is reduced from 8 Volts to 1.8 Volts, thereby turning off programming transistor 645.

The row address signals X[1] and X[0] are both selected to have logic 101 values, thereby identifying the first row, and the column address signals Y[1] and Y[0] are both selected to have logic 101 values, thereby identifying the first column.

Word line control circuit 620 provides a 0 Volt signal on the word line of the addressed row. Thus, in the described example, word line control circuit 620 provides a 0 Volt signal on word line $WL_0$. Under these conditions, p-channel access transistor 1101 turns on, thereby coupling the gate of storage transistor 1201 to bit line $BL_0$.

Bit line control circuit 630 asserts the bit line enable signal BLEN associated with the addressed column at a voltage of 0 Volts. Thus, in the described example, bit line control circuit 630 asserts the read enable signal BLEN[0] at 0 Volts. Under these conditions, p-channel bit line access transistor 641 turns on, thereby coupling the bit line $BL_0$ to the drain of p-channel output transistor 646.

If storage transistor 1201 is programmed, a conductive path will exist through storage transistor 1201. Under these conditions, storage transistor 1201 will pull down the voltage on bit line $BL_0$ to a voltage that is less than the threshold voltage of inverter 649. As a result, a logic low output signal OUT is provided.

Conversely, if storage transistor 1201 is not programmed, no conductive path exists through storage transistor 1201. Under these conditions, p-channel output transistor 648 and n-channel output transistor 647 pull up the voltage of bit line $BL_0$ to a voltage which is greater than the threshold voltage of inverter 649. As a result, a logic high output signal OUT is provided.

Word line control circuit 620 provides the $V_{CC}$ supply voltage to all of the word lines in the non-addressed rows. Thus, in the present example, word line control circuit 620 provides the $V_{CC}$ supply voltage of 1.8 Volts to word lines $WL_1$–$WL_3$. As a result, bit line access transistors 1105–1116 are turned off, thereby preventing memory cells 605–616 from being read.

Bit line control circuit 630 further provides logic high bit line enable signals BLEN to the non-addressed columns. Thus, in the present example, bit line control circuit 630 provides logic high bit line enable signals BLEN[1:3]. As a result, bit line access transistors 642–644 are turned off, thereby leaving bit lines $BL_1$–$BL_3$ floating.

Table 6 summarizes the various voltages applied to the addressed and non-addressed rows and columns during a read operation.

TABLE 6

|  | Addressed Row | Non-Addressed Row | Addressed Column | Non-Addressed Column |
| --- | --- | --- | --- | --- |
| WL | 0 V | 1.8 V | — | — |
| BLEN | — | — | 0 V | 1.8 V |
| BL | — | — | Coupled to Line 660 | Floating |

Figure 7:
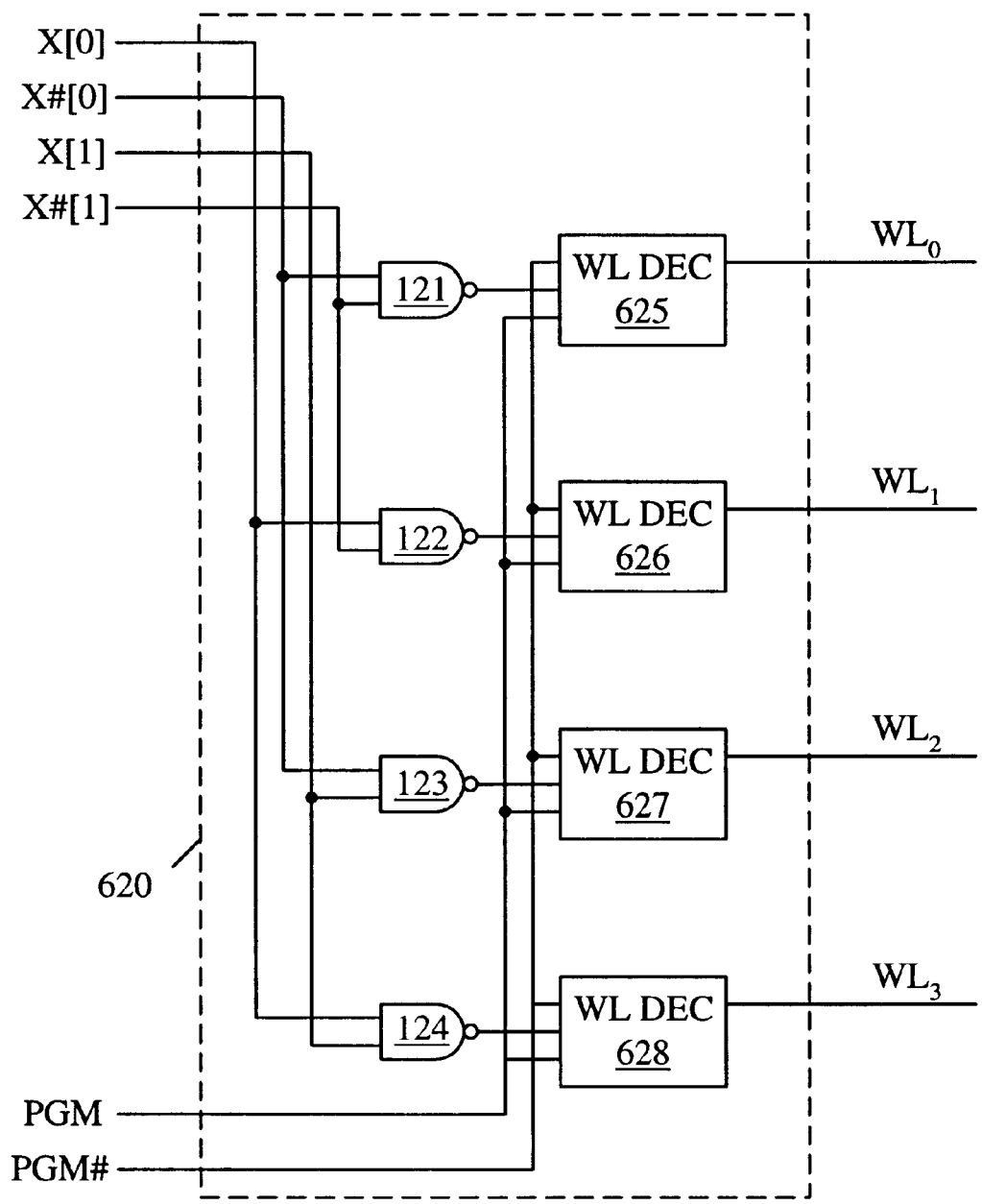
FIG. 7 is a block diagram of a word line control circuit for use with the memory system of FIG. 6 in accordance with one embodiment of the present invention.

FIG. 7 is a block diagram of word line control circuit 620. Word line control circuit 620 includes logical NAND gates 121–124 (which were described above in connection with word line control circuit 120 (FIG. 2)), and word line decoders 625–628.

Figure 8:
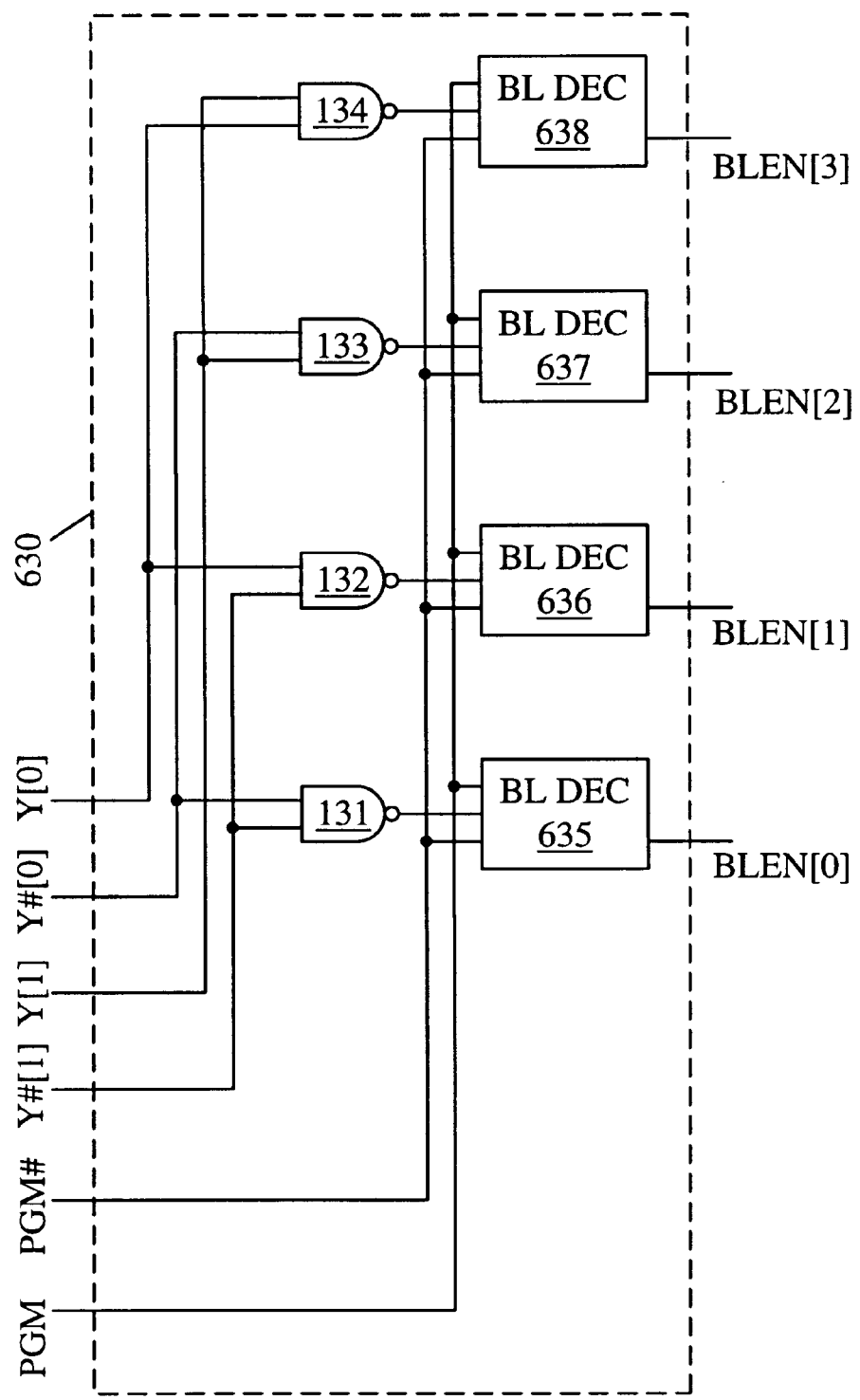
FIG. 8 is a block diagram of a bit line control circuit for use with the memory system of FIG. 6 in accordance with one embodiment of the present invention.

FIG. 8 is a block diagram of bit line control circuit 630. Bit line control circuit 630 includes logical NAND gates 131–134 (which were described above in connection with bit line control circuit 130 (FIG. 4)), and bit line decoders 635–638.

In the described embodiment, word line decoders 625–628 and bit line decoders 635–638 are identical. Thus, only decoder 625 is described in detail.

Figure 9:
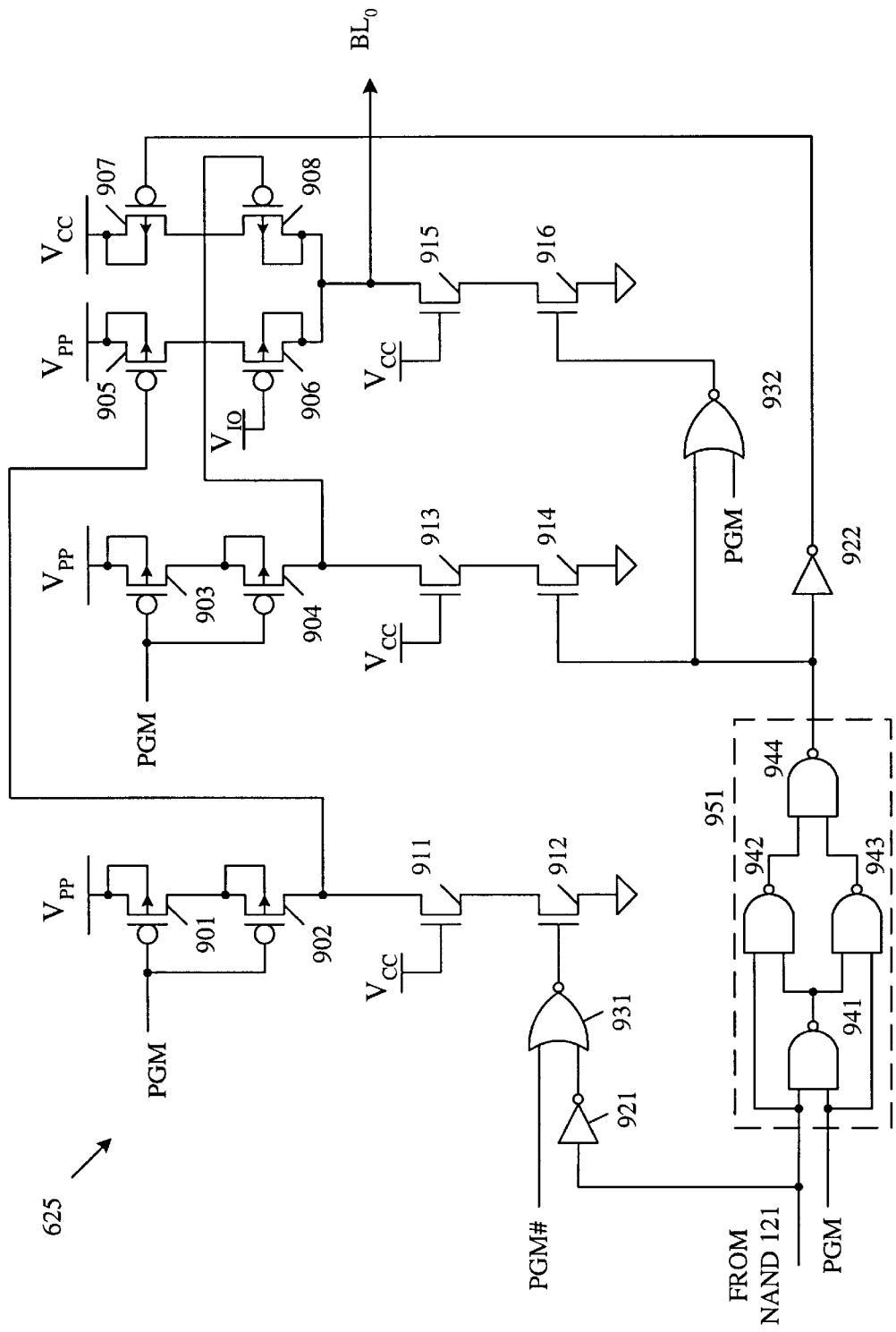
FIG. 9 is a schematic diagram of a word line decoder of the word line control circuit of FIG. 7 in accordance with one embodiment of the present invention.

FIG. 9 is a schematic diagram of word line decoder 625. Word line decoder 625 includes high voltage p-channel transistors 901–908, high voltage n-channel transistors 911–916, inverters 921–922, NOR gates 931–933 and exclusive OR gate 951, which includes NAND gates 941–944. Inverters 921–922, NOR gates 931–933 and exclusive OR gate 951 are constructed with low voltage p-channel and n-channel transistors in a manner known to those of ordinary skill in the art. Table 7 lists the width-to-length (W/L) dimensions of transistors 901–908 and 911–916 in accordance with the described embodiment.

TABLE 7

| Transistor(s) | W/L Dimensions (microns) |
| --- | --- |
| 901, 903 | 2/0.7 |
| 902, 904 | 8/0.7 |
| 905, 906, 907, 908 | 40/0.7 |
| 911 | 2/0.7 |
| 912 | 2/0.35 |
| 913, 915 | 4/0.7 |
| 914, 916 | 4/0.35 |

Word line decoder 625 operates as follows. Transistors 901–908 and 911–916 of word line decoder 625 are connected in the same manner as transistors 501–508 and 511–516 of bit line decoder 135 (FIG. 5). Thus, transistors 901–908 and 911–914 operate in the same manner described above for transistors 501–508 and 511–516.

Word Line Decoder—Program Mode

In the programming mode, the PGM signal has a logic high value and the PGM# signal has a logic low value. If the first row is the addressed row, then NAND gate 121 provides a logic low input signal to inverter 921. As a result, inverter 921 provides a logic high signal to NOR gate 931. In response to these signals, NOR gate 931 provides a logic low signal to the gate of n-channel transistor 912, thereby turning off this transistor and causing the programming voltage $V_{PP}$ (8 Volts) to be applied to the gate of p-channel transistor 905.

In addition, exclusive OR gate 951 provides a logic high output signal to the gate of n-channel transistor 914, thereby turning on this transistor and causing a low voltage (2 Volts) to be applied to the gate of p-channel transistor 908. The logic high voltage provided by exclusive OR gate 951 also causes inverter 922 to provide a logic low signal to the gate of p-channel transistor 907. Finally, NOR gate 932 provides a logic low signal to the gate of n-channel transistor 916 in response to the logic high PGM signal, thereby turning off this transistor 916. Under these conditions, p-channel transistors 905 and 906 are turned off, and p-channel transistors 907 and 908 are turned on, thereby providing the $V_{CC}$ supply voltage to word line $WL_0$.

If the first row is not the addressed row, then NAND gate 121 provides a logic high input signal to word line decoder 625. In response, NOR gate 931 provides a logic high signal, which turns on n-channel transistor 912. As a result, a low voltage (2 Volts) is applied to the gate of p-channel transistor 905. The logic high signal from NAND gate 121 also causes exclusive OR gate 951 to provide a logic low output signal to the gate of transistor 914, thereby turning off this transistor 914. As a result, the programming voltage $V_{PP}$ is applied to the gate of p-channel transistor 908. The logic high signal provided by exclusive OR gate 951 also causes inverter 922 to provide a logic low signal (0 Volts) to the gate of p-channel transistor 907. Again, the logic high PGM signal causes NOR gate 932 to provide a logic low signal to the gate of n-channel transistor 916, thereby turning off this transistor 916. Under these conditions, p-channel transistors 905 and 906 are turned on, thereby providing the programming voltage $V_{PP}$ to word line $WL_0$.

Word Line Decoder—Read Mode

In the read mode, the PGM signal has a logic low value and the PGM# signal has a logic high value. NOR gate 931 provides a logic low signal to the gate of n-channel transistor 912 in response to the logic high PGM# signal, thereby turning off this transistor 912. As a result, the programming voltage $V_{PP}$ is provided to the gate of p-channel transistor 905.

If the first row is the addressed row, then exclusive OR gate 951 receives a logic low signal from NAND gate 121. Because the PGM signal also has a logic low value at this time, exclusive OR gate 951 provides a logic low signal to the gate of n-channel transistor 914, thereby turning off this transistor 914. As a result, the programming voltage $V_{PP}$ is provided to the gate of p-channel transistor 908. The logic low signal provided by exclusive OR gate 951 also causes inverter 922 to provide a logic high signal to the gate of p-channel transistor 907. Finally, the logic low signal provided by exclusive OR gate 951 (along with the logic low PGM signal) causes NOR gate 932 to provide a logic high signal to n-channel transistor 916. Under these conditions, p-channel transistors 905–908 are turned off, and n-channel transistors 915–916 are turned on, thereby providing 0 Volts to word line $WL_0$.

If the first row is not the addressed row, then word line decoder 625 receives a logic high signal from NAND gate 121. In response, exclusive OR gate 951 provides a logic high output signal to the gate of n-channel transistor 914, thereby turning on this transistor and causing a low voltage (2 Volts) to be applied to the gate of p-channel transistor 908. The logic high voltage provided by exclusive OR gate 951 also causes inverter 922 to provide a logic low voltage to the gate of p-channel transistor 907. Finally, NOR gate 932 provides a logic low voltage to the gate of n-channel transistor 916 in response to the logic high voltage provided by exclusive OR gate 951, thereby turning off this transistor 916. Under these conditions, p-channel transistors 905 and 906 are turned off, and p-channel transistors 907 and 908 are turned on, thereby providing the $V_{CC}$ supply voltage to word line $WL_0$.

Charge Pump

The programming voltage $V_{PP}$ can be provided by a circuit external to the integrated circuit chip which includes memory system 100 (or memory system 600). In accordance with another embodiment of the present invention, the programming voltage $V_{PP}$ is provided by a charge pump circuit fabricated on the same integrated circuit chip as memory system 100 (or memory system 600). In accordance with this embodiment, the charge pump circuit is fabricated using CMOS devices that are compatible with a 0.18 micron CMOS process.

Figure 10:
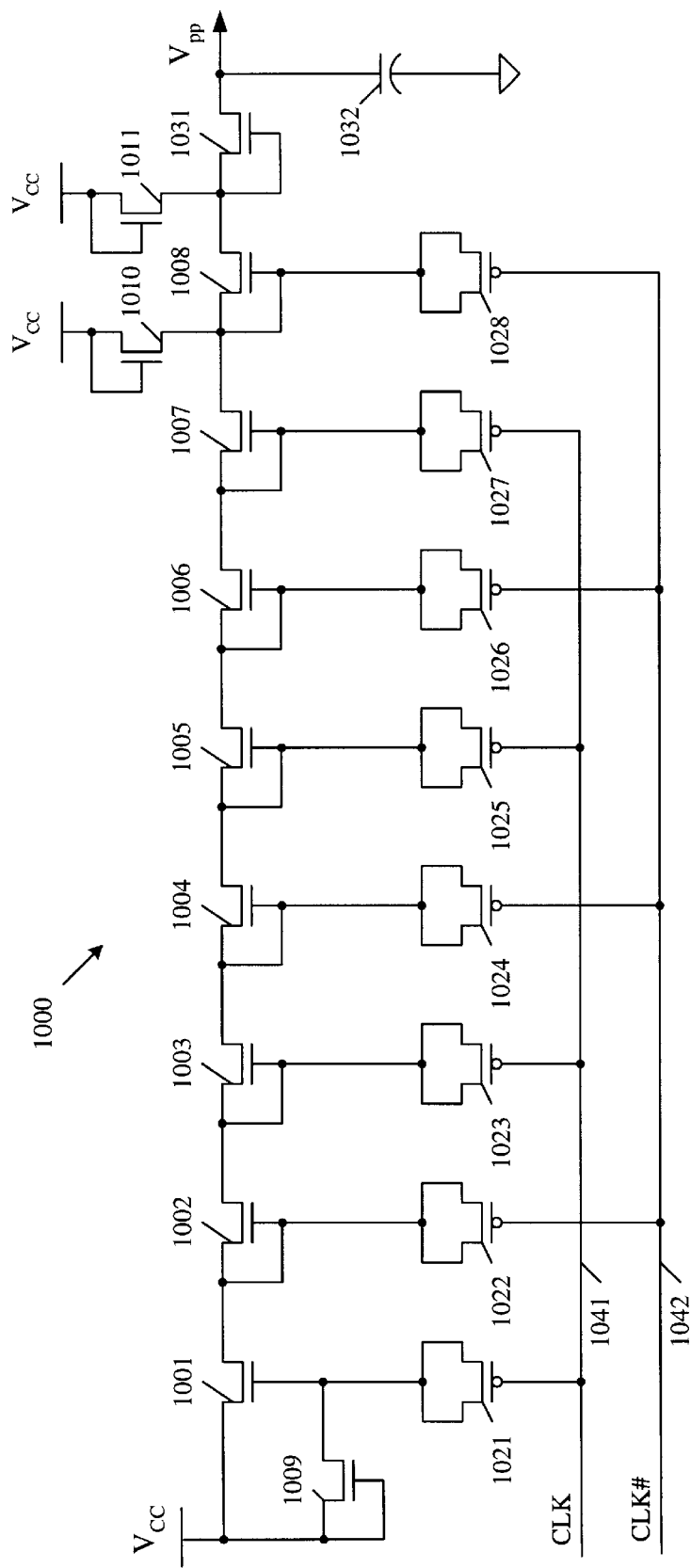
FIG. 10 is a schematic diagram of a charge pump circuit in accordance with one embodiment of the present invention.

FIG. 10 is a schematic diagram of a charge pump circuit 1000 in accordance with one embodiment of the present invention. Charge pump circuit 1000 includes n-channel transistors 1001–1011, p-channel transistors 1021–1028, diode 1031 and capacitor 1032. Each of n-channel transistors 1001–1011 is a high voltage CMOS transistor having a gate oxide thickness of 70 angstroms, a channel length of 20 microns and a channel width of 1 micron. Each of p-channel transistors 1021–1028 is a high voltage CMOS transistor having a gate oxide thickness of 70 angstroms, a channel length of 37 microns and a channel width of 17 microns.

N-channel transistors 1001–1008 are connected in series between the Vc voltage supply and the output diode 1031. N-channel transistor 1009 is connected as a diode between the source and gate of transistor 1001. A source-to-gate connection is provided for each of n-channel transistors 1002–1008, thereby causing these transistors to operate as diodes. N-channel transistors 1010 and 1011 are connected between the drains of transistors 1007 and 1008, respectively, and the $V_{CC}$ voltage supply. Transistors 1010 and 1011 are connected to operate as diodes that initially pull up the voltages on the drains of transistors 1007 and 1008.

The source and drains of p-channel transistors 1021–1028 are commonly connected to the gates of n-channel transistors 1001–1008, respectively. The gates of p-channel transistors 1021, 1023, 1025 and 1027 are coupled to clock signal line 1041. The gates of p-channel transistors 1022, 1024, 1026 and 1028 are coupled to clock signal line 1042. Clock signal line 1041 is coupled to receive a clock signal CLK, and clock signal line 1042 is coupled to receive a clock signal CLK#, which is the inverse of the clock signal CLK.

P-channel transistors 1021–1028 are connected as capacitors. During a first half cycle of the clock signal CLK, p-channel transistors 1021, 1023, 1025 and 1027 charge, and p-channel transistors 1022, 1024, 1026 and 1028 discharge. During the second half cycle of the clock signal CLK, p-channel transistors 1021, 1023, 1025 and 1027 discharge, and p-channel transistors 1022, 1024, 1026 and 1028 charge. As a result, charge is pumped through diode-connected transistor 1031 to output capacitor 1032. Output capacitor 1032 provides the output voltage $V_{PP}$.

The p-channel transistors closest to output capacitor 1032 experience the highest gate-to-source (and gate-to-drain) voltages. In the described embodiment, p-channel transistor 1028 experiences a gate-to-source voltage of approximately 8 Volts. However, p-channel transistor 1028 advantageously has relatively high breakdown voltage of about 11 Volts. Thus, p-channel transistor 1028 does not break down in response to the relatively high output voltage. Notably, an equivalently sized n-channel transistor would have a breakdown voltage that is at least 1.5 Volts less than p-channel transistor 1028.

In one embodiment of the present invention, the above-described non-volatile memory is used in a system-on-a-chip structure. System-on-a-chip structures are fabricated using a conventional CMOS process. Consequently, prior to the present invention, non-volatile memory was not available on system-on-a-chip structures.

A conventional system-on-a-chip (or supercomputer) structure includes, among other elements, a relatively large volatile memory array and logic circuitry coupled to the memory array. The large volatile memory array is typically a DRAM array having a capacity of 20 to 100 Mbytes. This memory array has a relatively wide data bus, which is characteristic of a system-on-a-chip structure. Typically, the memory array has a width of at least 512 bits.

Because it is normal for a small amount of defects to occur during semiconductor processing, it is difficult to fabricate the relatively large volatile memory array without defects. Several conventional mechanisms have been developed to deal with defects in the memory array. One mechanism involves testing the memory array in the factory, prior to completing the fabrication of the chip, thereby determining the location of any defective columns. A laser is then used to physically modify the interconnect structure of the chip, such that column address lines are re-routed from defective columns to functional redundant columns in the memory array. This mechanism is undesirable because the cost associated with the laser and the relatively long test and repair period.

Another conventional mechanism for handling defects in the memory array is a built in self-test (BIST) structure. A conventional BIST structure electrically tests the memory array after the fabrication of the chip is complete. The BIST structure writes any defective addresses to an associated register. At the end of the test, the contents of the register are read. If any addresses are stored in the register, then the chip is labeled as defective and thrown away.

Another conventional mechanism uses a volatile built in self-repair structure (BISR) structure in conjunction with the BIST structure. In this case, each time the chip is powered up, the BIST structure electrically tests the memory array, and provides the defective column addresses to the BISR structure. In response, the BISR structure is configured to electrically re-route the address signals provided to the memory array. More specifically, the BISR structure is configured such that when a defective column address is provided to the BISR structure, the BISR structure translates this defective column address to a functional redundant column address. The BISR structure is configured by programming volatile memory elements present in the BISR structure. Because the memory array is relatively large, the self test and self repair procedures take a relatively long time. Moreover, because the configuration of the BISR structure is stored in volatile memory elements, the self-test and self-repair procedures must be performed each time the chip is powered up.

Figure 11:
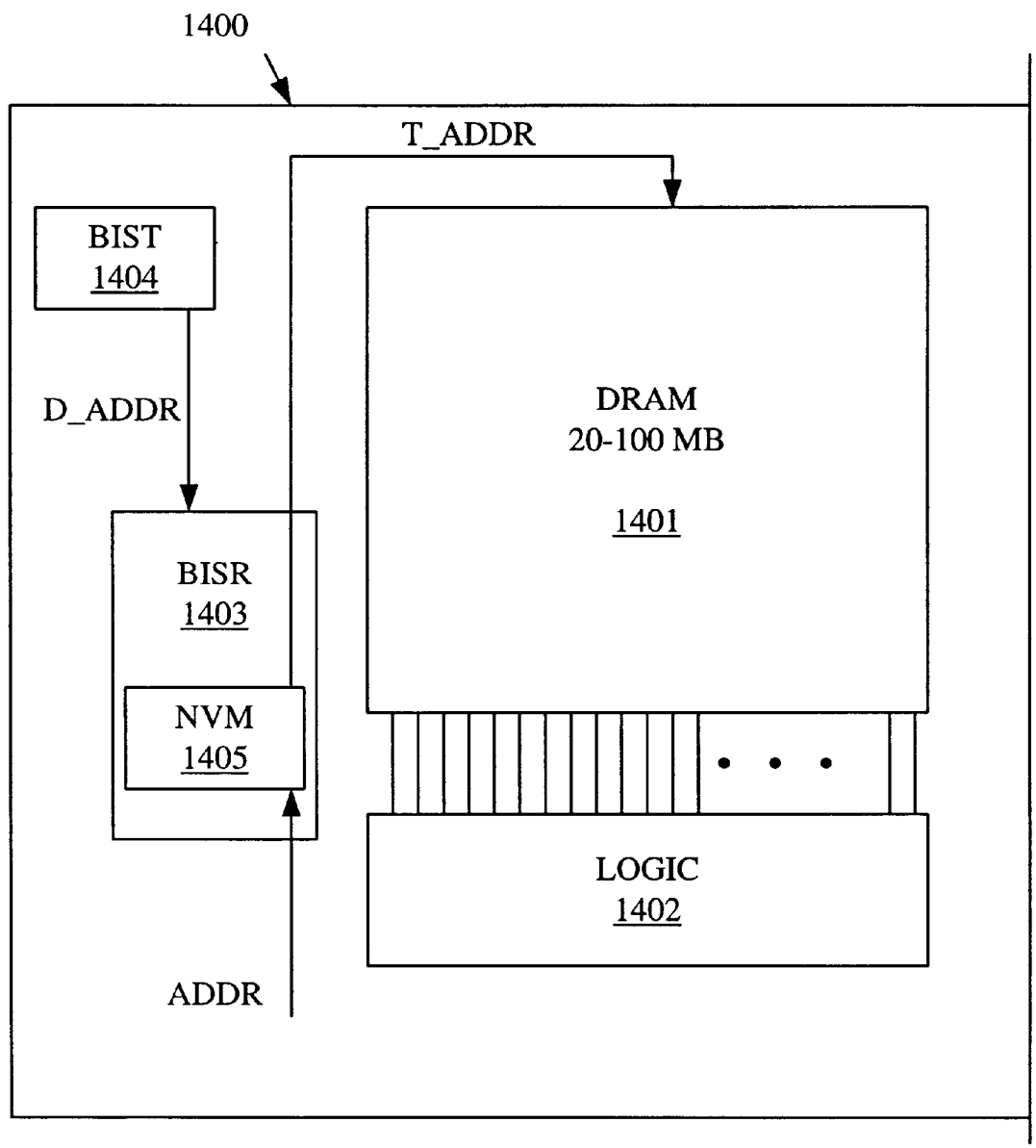
FIG. 11 is a block diagram of a system-on-a-chip structure that uses the non-volatile memory in accordance with one embodiment of the present invention.

FIG. 11 is a block diagram of a system-on-a-chip structure 1400 that uses the above-described CMOS compatible non-volatile memory in accordance with one embodiment of the present invention. System-on-a-chip structure 1400 includes a relatively large volatile memory array 1401, logic circuitry 1402, BISR circuitry 1403, BIST circuitry 1404 and non-volatile memory 1405.

In the described embodiment, memory array 1401 is a DRAM array having a capacity of 20 to 100 Mbytes. Memory array 1401 has a data bus with a width of at least 512 bits. Prior to shipping, system-on-a-chip structure 1400 is initialized by powering up the chip. At this time, conventional BIST circuitry 1404 is controlled to electrically test memory array 1401 for defects. BIST circuitry 1404 provides addresses (D_ADDR) associated with any defective memory cells to BISR circuitry 1403. In response to these defective addresses, BISR circuitry 1403 programs non-volatile memory 1405 to implement a re-routing function. This re-routing function enables non-volatile memory 1405 to receive addresses intended to access the defective memory cells, and in response, provide translated addresses (T_ADDR) to locations corresponding with functional redundant memory cells. Because the BISR circuitry 1403 implements non-volatile memory 1405, only one initialization procedure is required.

Although the invention has been described in connection with several embodiments, it is understood that this invention is not limited to the embodiments disclosed, but is capable of various modifications which would be apparent to a person skilled in the art. Thus, the invention is limited only by the following claims.

What is claimed is:

1. A decoder circuit for applying a plurality of control voltages to a control line in a memory array, the decoder circuit comprising:
   a first pair of high voltage p-channel transistors coupled in series between a programming voltage supply and the control line, wherein the first pair of p-channel transistors are turned on to couple the programming voltage supply to the control line; and
   a second pair of high voltage p-channel transistors coupled in series between a normal voltage supply and the control line, wherein the second pair of p-channel transistors are turned on to couple the normal voltage supply to the control line.

2. The decoder circuit of claim 1, further comprising a pair of high voltage n-channel transistors coupled in series between the control line and a ground voltage supply, wherein the pair of n-channel transistors is turned on to couple the ground voltage supply to the control line.

3. The decoder circuit of claim 1, wherein the first pair of high-voltage p-channel transistors comprises:
   a first high voltage p-channel transistor having a source coupled to the programming voltage supply; and
   a second high voltage p-channel transistor having a source coupled to a drain of the first transistor, a drain coupled to the control line, and a gate coupled to the normal voltage supply.

4. The decoder circuit of claim 3, wherein the second pair of high-voltage p-channel transistors comprises:
   a third high voltage p-channel transistor having a source coupled to the normal voltage supply; and
   a fourth high voltage p-channel transistor having a source coupled to a drain of the third transistor, and a drain coupled to the control line.

5. The decoder circuit of claim 4, further comprising:
   a first high voltage inverter coupled to a gate of the first high voltage p-channel transistor; and
   a second high voltage inverter coupled to a gate of the fourth high voltage p-channel transistor.

6. The decoder circuit of claim 5, wherein the first high voltage inverter comprises:
   a fifth high voltage p-channel transistor having a source coupled to the programming voltage supply;
   a sixth high voltage p-channel transistor having a source coupled to a drain of the fifth high voltage p-channel transistor, a drain coupled to a gate of the first high voltage p-channel transistor and a gate coupled to a gate of the fifth high voltage p-channel transistor;
   a first n-channel transistor having a source coupled to the drain of the sixth high voltage p-channel transistor, and a gate coupled to the normal voltage supply; and
   a second n-channel transistor having a source coupled to a drain of the first n-channel transistor, and a drain coupled to ground.

7. The decoder circuit of claim 6, wherein the second high voltage inverter comprises:
   a seventh high voltage p-channel transistor having a source coupled to the programming voltage supply;
   an eighth high voltage p-channel transistor having a source coupled to a drain of the seventh high voltage p-channel transistor, a drain coupled to a gate of the fourth high voltage p-channel transistor and a gate coupled to a gate of the seventh high voltage p-channel transistor;
   a third n-channel transistor having a source coupled to the drain of the eighth high voltage p-channel transistor, and a gate coupled to the normal voltage supply; and
   a fourth n-channel transistor having a source coupled to a drain of the third n-channel transistor, and a drain coupled to ground.

8. The decoder circuit of claim 4, further comprising a control circuit for driving a gate of the third high voltage p-channel transistor, wherein the control circuit drives the gate with the normal voltage supply and a ground voltage supply.

\* \* \* \* \*